(12) United States Patent
Rueckes et al.

(10) Patent No.: US 8,574,673 B2
(45) Date of Patent: Nov. 5, 2013

(54) ANISOTROPIC NANOTUBE FABRIC LAYERS AND FILMS AND METHODS OF FORMING SAME

(75) Inventors: Thomas Rueckes, Rockport, MA (US); Ramesh Sivarajan, Shrewsbury, MA (US); Rahul Sen, Wilmington, MA (US)

(73) Assignee: Nantero Inc., Woburn, MA (US)

( * ) Notice: Subject to any disclaimer, the term of this patent is extended or adjusted under 35 U.S.C. 154(b) by 314 days.

(21) Appl. No.: 12/533,704

(22) Filed: Jul. 31, 2009

(65) Prior Publication Data

US 2011/0027491 A1   Feb. 3, 2011

(51) Int. Cl.
*B05D 1/02* (2006.01)
*B05D 1/18* (2006.01)

(52) U.S. Cl.
USPC ............... 427/240; 427/421.1; 427/430.1

(58) Field of Classification Search
USPC .................... 427/240, 421.1, 430.1
See application file for complete search history.

(56) References Cited

U.S. PATENT DOCUMENTS

| | | | |
|---|---|---|---|
| 6,057,637 A | 5/2000 | Zettl et al. |
| 6,187,823 B1 | 2/2001 | Haddon et al. |
| 6,277,318 B1 | 8/2001 | Bower et al. |
| 6,331,262 B1 | 12/2001 | Haddon et al. |
| 6,342,276 B1 | 1/2002 | You |
| 6,368,569 B1 | 4/2002 | Haddon et al. |
| 6,409,567 B1 | 6/2002 | Amey, Jr. et al. |
| 6,422,450 B1 | 7/2002 | Zhou et al. |
| 6,423,583 B1 | 7/2002 | Avouris et al. |
| 6,495,116 B1 | 12/2002 | Herman |
| 6,495,258 B1 | 12/2002 | Chen et al. |
| 6,515,339 B2 | 2/2003 | Shin et al. |
| 6,528,020 B1 | 3/2003 | Dai et al. |
| 6,531,513 B2 | 3/2003 | Haddon et al. |
| 6,630,772 B1 | 10/2003 | Bower et al. |
| 6,641,793 B2 | 11/2003 | Haddon et al. |
| 6,645,628 B2 | 11/2003 | Shiffler, Jr. et al. |
| 6,706,402 B2 | 3/2004 | Rueckes et al. |
| 6,707,098 B2 | 3/2004 | Hofmann et al. |

(Continued)

FOREIGN PATENT DOCUMENTS

| | | |
|---|---|---|
| EP | 0947466 A1 | 3/1998 |
| EP | 1061040 A1 | 12/2000 |

(Continued)

OTHER PUBLICATIONS

Aligning and Reorienting Carbon Nanotubes with Nematic Liquid Crystals, Dierking et al, Adv. Mater. (16), No. 11, Jun. 4, 2004, pp. 865-869.*

(Continued)

*Primary Examiner* — Frederick Parker
(74) *Attorney, Agent, or Firm* — Nantero Inc.

(57) ABSTRACT

Methods for forming anisotropic nanotube fabrics are disclosed. In one aspect, a nanotube application solution is rendered into a nematic state prior to its application over a substrate. In another aspect, a pump and narrow nozzle assembly are employed to realize a flow induced alignment of a plurality of individual nanotube elements as they are deposited onto a substrate element. In another aspect, nanotube adhesion promoter materials are used to form a patterned nanotube application layer, providing narrow channels over which nanotube elements will self align during an application process. Specific dip coating processes which are well suited for aiding in the creation of anisotropic nanotube fabrics are also disclosed.

8 Claims, 22 Drawing Sheets

(56) References Cited

U.S. PATENT DOCUMENTS

| | | | |
|---|---|---|---|
| 6,752,977 B2 | 6/2004 | Smalley et al. |
| 6,808,746 B1 | 10/2004 | Dai et al. |
| 6,833,558 B2 | 12/2004 | Lee et al. |
| 6,835,591 B2 | 12/2004 | Rueckes et al. |
| 6,858,197 B1 | 2/2005 | Delzeit |
| 6,863,942 B2 | 3/2005 | Ren et al. |
| 6,888,773 B2 | 5/2005 | Morimoto |
| 6,890,780 B2 | 5/2005 | Lee |
| 6,896,864 B2 | 5/2005 | Clarke |
| 6,899,945 B2 | 5/2005 | Smalley et al. |
| 6,905,892 B2 | 6/2005 | Esmark et al. |
| 6,918,284 B2 | 7/2005 | Snow et al. |
| 6,919,592 B2 | 7/2005 | Segal et al. |
| 6,919,740 B2 | 7/2005 | Snider |
| 6,921,575 B2 | 7/2005 | Horiuchi et al. |
| 6,924,538 B2 | 8/2005 | Jaiprakash et al. |
| 6,946,410 B2 | 9/2005 | French et al. |
| 7,015,500 B2 | 3/2006 | Choi et al. |
| 7,057,402 B2 | 6/2006 | Cole et al. |
| 7,115,864 B2 | 10/2006 | Colbert et al. |
| 7,115,901 B2 | 10/2006 | Bertin et al. |
| 7,161,403 B2 | 1/2007 | Bertin |
| 7,259,410 B2 | 8/2007 | Jaiprakash et al. |
| 7,335,395 B2 | 2/2008 | Ward et al. |
| 7,365,632 B2 | 4/2008 | Bertin et al. |
| 7,375,369 B2 | 5/2008 | Sen et al. |
| 7,416,993 B2 | 8/2008 | Segal et al. |
| 7,566,478 B2 | 7/2009 | Ward et al. |
| 7,781,862 B2 | 8/2010 | Bertin et al. |
| 7,835,170 B2 | 11/2010 | Bertin et al. |
| 2001/0004979 A1 | 6/2001 | Han et al. |
| 2002/0081380 A1 | 6/2002 | Dillon et al. |
| 2002/0160111 A1 | 10/2002 | Sun et al. |
| 2002/0175390 A1 | 11/2002 | Goldstein et al. |
| 2003/0004058 A1 | 1/2003 | Li et al. |
| 2003/0012723 A1 | 1/2003 | Clarke |
| 2003/0017560 A1 | 1/2003 | Ho et al. |
| 2003/0065206 A1 | 4/2003 | Bolskar et al. |
| 2003/0122111 A1 | 7/2003 | Glatkowski |
| 2003/0177450 A1 | 9/2003 | Nugent |
| 2003/0178617 A1 | 9/2003 | Appenzeller |
| 2003/0200521 A1 | 10/2003 | DeHon et al. |
| 2003/0220518 A1 | 11/2003 | Bolskar et al. |
| 2004/0005723 A1 | 1/2004 | Empedocles et al. |
| 2004/0007528 A1 | 1/2004 | Bakajin et al. |
| 2004/0023253 A1 | 2/2004 | Kunwar et al. |
| 2004/0023514 A1* | 2/2004 | Moriya et al. ................ 438/778 |
| 2004/0031975 A1 | 2/2004 | Kern et al. |
| 2004/0034177 A1 | 2/2004 | Chen |
| 2004/0041154 A1 | 3/2004 | Watanabe et al. |
| 2004/0043527 A1 | 3/2004 | Bradley et al. |
| 2004/0071949 A1* | 4/2004 | Glatkowski et al. ....... 428/313.3 |
| 2004/0099438 A1 | 5/2004 | Arthur et al. |
| 2004/0104129 A1 | 6/2004 | Gu et al. |
| 2004/0106741 A1 | 6/2004 | Kriesel et al. |
| 2004/0132070 A1 | 7/2004 | Star et al. |
| 2004/0181630 A1 | 9/2004 | Jaiprakash et al. |
| 2004/0253167 A1 | 12/2004 | Silva et al. |
| 2004/0265550 A1 | 12/2004 | Glatkowski et al. |
| 2004/0266106 A1 | 12/2004 | Lee |
| 2005/0053525 A1 | 3/2005 | Segal et al. |
| 2005/0058797 A1 | 3/2005 | Sen et al. |
| 2005/0065741 A1 | 3/2005 | Segal et al. |
| 2005/0095938 A1 | 5/2005 | Rosenberger et al. |
| 2005/0101112 A1 | 5/2005 | Rueckes et al. |
| 2005/0142281 A1 | 6/2005 | Molaire |
| 2005/0212014 A1 | 9/2005 | Horibe et al. |
| 2005/0269554 A1 | 12/2005 | Sen et al. |
| 2006/0052509 A1 | 3/2006 | Saitoh |
| 2006/0204427 A1 | 9/2006 | Ghenciu et al. |
| 2006/0237537 A1 | 10/2006 | Empedocles et al. |
| 2006/0250843 A1 | 11/2006 | Bertin et al. |
| 2006/0250856 A1 | 11/2006 | Bertin et al. |
| 2006/0258122 A1 | 11/2006 | Whitefield et al. |
| 2006/0264053 A1 | 11/2006 | Yates |
| 2006/0276056 A1 | 12/2006 | Ward et al. |
| 2006/0281256 A1 | 12/2006 | Carter et al. |
| 2006/0281287 A1 | 12/2006 | Yates et al. |
| 2006/0281306 A1 | 12/2006 | Gstrein et al. |
| 2006/0292716 A1 | 12/2006 | Gu et al. |
| 2007/0004191 A1 | 1/2007 | Gu et al. |
| 2007/0014979 A1 | 1/2007 | Bullock et al. |
| 2008/0157126 A1 | 7/2008 | Bertin et al. |
| 2008/0159042 A1 | 7/2008 | Bertin et al. |
| 2008/0170429 A1 | 7/2008 | Bertin et al. |
| 2008/0207581 A1 | 8/2008 | Whiteford et al. |
| 2009/0020924 A1 | 1/2009 | Lin |
| 2009/0087630 A1 | 4/2009 | Ward et al. |
| 2009/0095412 A1 | 4/2009 | Abrams et al. |
| 2010/0001255 A1 | 1/2010 | Bao et al. |
| 2010/0267205 A1 | 10/2010 | Ward et al. |

FOREIGN PATENT DOCUMENTS

| | | |
|---|---|---|
| GB | 2 364 933 A | 2/2002 |
| JP | 2000-203821 | 7/2000 |
| JP | 2001-035362 A2 | 2/2001 |
| JP | 2004-090208 A2 | 3/2004 |
| TW | I313669 | 8/2009 |
| WO | WO-98/39250 A1 | 9/1998 |
| WO | WO-99/65821 A1 | 12/1999 |
| WO | WO-00/17101 A1 | 3/2000 |
| WO | WO-01/03208 A1 | 1/2001 |
| WO | WO-02/45113 A2 | 6/2002 |
| WO | WO-02/48701 A2 | 6/2002 |
| WO | WO-02/060812 A2 | 8/2002 |
| WO | WO-03/016901 A1 | 2/2003 |
| WO | WO-03/022733 A2 | 3/2003 |
| WO | WO-03/034142 A1 | 4/2003 |
| WO | WO-03/091486 A1 | 11/2003 |
| WO | WO-2004/039893 A1 | 5/2004 |
| WO | WO-2004/065655 A1 | 8/2004 |
| WO | WO-2004/065657 A1 | 8/2004 |
| WO | WO-2004/065671 A1 | 8/2004 |
| WO | WO-2006/078293 A2 | 7/2006 |

OTHER PUBLICATIONS

Ago et al., "Workfunction of Purified and Oxidised Carbon Nanotubes," Synthetic Metals, vol. 103, pp. 2494-2495 (1999).

Ajayan et al., "Application of Carbon Nanotubes," Carbon Nanotubes, Topics Appl. Phys. vol. 80, pp. 391-425, Springer-Verlag Berlin Heidelberg (2001).

Ausman, "Organic Solvent Dispersions of Single-Walled Carbon Nanotubes: Toward Solutions of Pristine Nanotubes," The Journal of Physical Chemistry, vol. 104, No. 38, Sep. 28, 2000, pp. 8911-8915.

Author Unknown, "Research—Multifunctional Nanotube Composites," retrieved on Jun. 10, 2004 from http://www.ornl.gov/-odg/compositesmain.html, 5 pages.

Author Unknown, "Wondrous World of Carbon Nanotubes," Multi Disciplinair Project: Wondrous World of Carbon Nano Tubes, retrieved on Jun. 10, 2004 from http://students.chem.tue.nl.ifp03/p;urification.html, 11 pages.

Avouris, P., et al., "Carbon Nanotube Electronics," Chemical Physics, 2002, vol. 284, pp. 429-445.

Awano, Y., "Graphene for VLSI: FET and Interconnect Applications" IEDM 2009 Technical Digest, pp. 10.1.1-10.1.4.

Bahr, "Dissolution of Small Diameter Single-Wall Carbon Nanotubes in Organic Solvents?," Chem. Commun, 2001, pp. 193-194.

Banerjee et al., "Functionalization of Carbon Nanotubes with a Metal-Containing Molecular Complex," Nano Letters, vol. 2, No. 1, pp. 49-53 (2002).

Berhan et al., "Mechanical properties of nanotubes sheets: Alterations in joint morphology and achievable moduli in manufacturable materials," Journal of applied Physics, vol. 95, No. 8, pp. 4335-4345 (Apr. 15, 2004).

Bonard, J. M. et al., "Monodisperse Multiwall Carbon Nanotubes Obtained with Ferritin as Catalyst", Nano Letters, vol. 2, No. 6, pp. 665-667, 2002.

(56) References Cited

OTHER PUBLICATIONS

Brown, K.M. "System in package "The Rebirth of SIP"," 2004 IEEE Custom Integrated Circuits Conference, May 2004, 6 pages.
Cassell, A. M. et al., "Large Scale CVD Synthesis of Single-Walled Carbon Nanotubes", J. Phys. Chem. B, pp. 6484-6492, 1999.
Chen, "Dissolution of Full-Length Single-Walled Carbon Nanotubes," J. Phys. Chem. B 2001, 105, pp. 2525-2528.
Chen, "Noncovalent Sidewall Functionalization of Single-Walled Carbon Nanotubes for Protein Immobilization," J. Am. Chem. Soc. 2001, 123, pp. 3838-3839.
Chen, "Solution Properties of Single-Walled Carbon Nanotubes," Science, vol. 282, Oct. 2, 1998, pp. 95-98.
Chen, B. et al., "Heterogeneous Single-Walled Carbon Nanotbue Catalyst Discovery and Optimization", Chem, Mater., vol. 14, pp. 1891-1896, 2002.
Cheng, H M., "Large-scale and low-cost synthesis of single-walled carbon nanotubes by the catalytic pyrolysis of hydrocarbons", Applied Physics Letters, vol. 72, No. 25, pp. 3282-3284, Jun. 22, 1998.
Chiang, et al., Purification and Characterization of Single-Wall Carbon Nanotubes (SWNTs) Obtained from the Gas-Phase Decomposition of CO (HiPco Process), J. Phys. Chem. B, vol. 105, pp. 1157-1161, 2001.
Collins, P.G., et al., "Engineering Carbon Nanotubes and Nanotube Circuits Using Electrical Breakdown", Science, 2001. 292, 706-709.
Colomer, "Different Purification Methods of Carbon Nanotubes Produced by Catalytic Synthesis," Synthetic Metals 103 (1999), pp. 2482-2483.
Crowley, M. et al., "512 Mb PROM with 8 layers of antifuse/Diode cells," IEEE International Solid-State Circuits Conference, vol. XLVI, pp. 284-285, Feb. 2003.
Cui, J.B. et al., "Carbon nanotube memory devices of high charge storage stability," Applied Physics Letters, vol. 81, No. 17, Oct. 21, 2002, pp. 3260-3262.
Dai, H. et al., "Controlled Chemical Routes to Nanotube Artchitectures, Physics, and Devices", J. Phys. Chem. B, vol. 103, pp. 11246-11255, 1999.
Delzeit et al., "Multilayered metal catalysts for controlling the density of single-walled carbon nanotubes growth," Chemical Physics letters, vol. 348, pp. 368-374, Nov. 16, 2001.
Derycke, V., et al., "Carbon Nanotube Inter- and Intramolecular Logic Gates", Nano Letters, 2001, vol. 1, No. 9, pp. 453-456.
Desai et al., "Frestanding Carbon Nanotube Specimen Fabrication," Proc. of 2005, 5th IEEE Conf. nanotech, Nagoya, Japan, Jul. 2005, pp. 1-4.
Dierking, et al., "Aligning and Reorienting Carbon Nanotubes with Nematic Liquid Crystals," Advanced Materials, 16, No. 11, Jun. 4, 2004, pp. 865-869.
Dillon, "A Simple and Complete Purification of Single-Walled Carbon Nanotube Materials," Advanced Materials 1999, 11, No. 16, pp. 1354-1359.
Franklin, N. R. et al., "An Enhanced CVD Approach to Extensive Nanotube Networks with Directionality", Advanced Materials, 2000, pp. 890-894.
Fuhrer, M.S. et al., "High-Mobility Nanotube Transistor Memory," Nano Letters, 2002, vol. 2, No. 7, pp. 755-759.
Georgakilas, "Organic Functionalization of Carbon Nanotubes," J. Am. Chem. Soc., vol. 124, No. 5, 2002, pp. 760-761.
Gromov, "Purification of Carbon Nanotubes," Caramel workshop, Jan. 23, 2002.
Haddon et al.,"Purification and Separation of Carbon Nanotubes," *MRS Bulletin*, , pp. 252-259, Apr. 2004.
Hefner, J. H. et al., "Catalytic growth of single-wall carbon nanotubes from metal particles", Chemical Physics Letters, vol. 296, pp. 195-202, Oct. 30, 1998.
Hirsch, "Functionalization of Single-Walled Carbon Nanotubes," Agnew, Chem. Int. Ed. 2002, 41, No. 11, pp. 1853-1859.
Homma, Y. et al., "Single Walled Carbon Nanotube Growth on Silicon Substrates Using Nanoparticle Catalysts", Jpn. J. Appl. Phys., vol. 41, Pt. 2, No. 1A/B, pp. L89-91, 2002.

Hone, J., "Phonons and Thermal Properties of Carbon Nanotubes", *Carbon Nanotubes, Topics Appl. Phys.*, vol. 80, pp. 273-286, 2001.
Hou, "Multi-Step Purification of Carbon Nanotubes," Carbon 40 (2002), pp. 81-85.
Huai, Y. "Spin-Transfet Torque MRAM (STT-MTAM): Challenges and Prospects" AAPS Bulletin Dec. 2008, vol. 18, No. 6, pp. 33-40.
International Search Authority, International Search Report for PCT/US2005/045316 mailed Sep. 6, 2006, 2 pages.
International Search Report and Written Opinion for International Patent Application PCT/US05/18467, mailed Oct. 1, 2007, 5 pages.
International Search Report and Written Opinion of the International Searching Authority, the United States Patent and Trademark Office, for International Application No. PCT/US2010/043207, dated Sep. 2, 2010, 8 pages.
International Search Report of the International Searching Authority, the United States Patent and Trademark Office, for International Application No. PCT/US2005/017839, dated Aug. 10, 2006, 1 page.
International Search Report of the International Searching Authority, the United States Patent and Trademark Office, for International Application No. PCT/US2005/018465, dated Aug. 21, 2006, 2 pages.
International Search Report, International Searching Authority, for International Application PCT/US05/18539, mailed Sep. 18, 2006, 4 pages.
International Searching Report of the International Searching Authority, the United States Patent and Trademark Office, for International Application No. PCT/US2005/018600, dated Aug. 3, 2006, 1 page.
Islam, "High Weight Fraction Surfactant Solubilization of Single-Wall Carbon Nanotubes in Water," Nano Letters, 2003, vol. 3, No. 2, pp. 269-273.
Jeong et al., "A new purification method of single-wall carbon nanotubes using H2S and O2 mixture gas," Chemical Physics Letters, vol. 344, pp. 18-22, Aug. 17, 2001.
Jiang, Y. et al., "Performance Breakthrough in 8nm Gate-All-Around Length Gate-All-Around Nanowire Transistors using Metallic Nanowire Contacts" 2008 Symposium on VLSI Technology Digest of Technical Papers, pp. 34-35.
Johnson, "IBM Grows Nanotube Patterns on Silicon Wafers," EETimes, Sep. 30, 2002, URL: http://www.eetimes.com/article/showArticle.jhtml?articleID=18307520.
Johnson, R. Colin, "IBM Fellow Unrolls Blueprint for Nano," EETimes Online, Mar. 6, 2006, 3 pages.
Joselevich, E., "Vectorial Growth of Metallic and Semiconducting Single-Wall Carbon Nanotubes", Nano Letters, vol. 0, No. 0, A-E, 2002, 5 pages.
Kahn, M.G.C. et al., "Solubilization of Oxidized Single-Walled Carbon Nanotubes in Organic and Aqueous Solvents through Organic Derivatization," Nano Letters 2002, vol. 2, No. 11, pp. 1215-1218.
Kianian, S. et al., "A 3D Stackable Carbon Nanotube-based Nonvolatile Memory (NRAM)," ESSDERC, Jun. 14, 2010, Nantero, Inc., 4 pages.
Kong, J. et al., "Chemical vapor deposition of methane for single-walled carbon nanotubes", Chemical Physics Letters, pp. 567-574, Aug. 14, 1998.
Kong, J. et al., "Nanotube Molecular Wires as Chemical Sensors," Science, 2000, vol. 287 pp. 622-625.
Kong, J. et al., "Quantum Interference and Ballistic Transmission in Nanotube Electron Waveguides", *The American Physical Society*, Physical Review Letters, vol. 87, No. 10, pp. 106801-1-106801-4, Sep. 3, 2001.
Langer, L. et al., "Electrical Resistance of a Carbon Nanotube Bundle," J. Mater. Res. vol. 9, No. 4, Apr. 1994, pp. 927-932.
Li, J. et al., "Carbon Nanotube Nanoelectrode Array for Ultrasensitive DNA Detection", Nano Letters, vol. 3, No. 5, pp. 597-602, 2003.
Li, Y. et al., "Growth of Single-Walled Carbon Nanotubes from Discrete Catalytic Nanoparticles of Various Sizes", J. Phys. Chem. B, vol. 105, pp. 11424-11431, 2001.
Li, Y. et al., "Preparation of Monodispersed Fe—Mo Nanoparticles as the Catalyst for CVD Synthesis of Carbon Nanotubes", Chem. Mater., vol. 13. pp. 1008-1014, 2001.
Martinez, "Modifications of Single-Wall Carbon Nanotubes Upon Oxidative Purification Treatments," Institute of Physics Publishing, Nanotechnology 14 (2003), pp. 691-695.

(56) References Cited

OTHER PUBLICATIONS

Matarredona, "Dispersion of Single-Walled Carbon Nanotubes in Aqueous Solutions of the Anionic Surfactant NaDDBS," J. Phys. Chem. B 2003, 107, pp. 13357-13367.

Mickelson, "Solvation of Fluorinated Single-Wall Carbon Nanotubes in Alcohol Solvents," J. Phys. Chem. B 1999, 103, pp. 4318-4322.

Moore, "Individually Suspended Single-Walled Carbon Nanotubes in Various Surfactants," Nano Letters 2003, vol. 3, No. 10, pp. 1379-1382.

Murphy, "High-Yield, Nondestructive Purification and Quantification Method for Multiwalled Carbon Nanotubes," J. Phys. Chem. B 2002, 106, pp. 3087-3091.

Nerushev, O. A., et al., "Carbon nanotube films obtained by thermal chemical vapour deposition", J. Mater. Chem., vol. 11, pp. 1122-1132, 2001.

Niu, Chunming et al., "High Power Electrochemical Capacitors Based on Carbon Nanotube Electrodes," Appl. Phys. Lett. 70(11), Mar. 17, 1997, pp. 1480-1482.

Niyogi, "Ultrasonic Dispersions of Single-Walled Carbon Nanotubes," J. Phys. Chem. B 2003, 107, pp. 8799-8804.

Novak, J.P. et al., "Nerve agent detection using networks of single-walled carbon nanotubes," Applied Physics Letters, Volumber 83, No. 19, Nov. 10, 2003, pp. 4026-4028.

O'Connell, "Reversible Water-Solubilization of Single-Walled Carbon Nanotubes by Polymer Wrapping," Chemical Physics Letters 342 (2001), pp. 265-271.

Onoa, G.B. et al., "Bulk production of singly dispersed carbon nanotubes with prescribed lengths," Nanotechnology, vol. 16, pp. 2799-2803, 2005.

Parikh, et al., "Flexible vapour sensors using single walled carbon nanotubes", Elsevier, Sensors and Actuators, B 113, pp. 55-63, 2006.

Peigney, M. et al., "A Study of the Formation of Single- and Double-Walled Carbon Nanotubes by a CVD Method", J. Phys. Chem. B., vol. 105, pp. 9699-9710, 2001.

Pompeo, "Water Solubilization of Single-Walled Carbon Nanotubes by Functionalization with Glucosamine," Nano Letters 2002, vol. 2, No. 4, pp. 369-373.

Qi, P. et al., "Toward Large Arrays of Multiplex Functionalization Carbon Nanotube Sensors for Highly Sensitive and Selective Molecular Detection," *Nano Lett.* 2003, vol. 3(3), pp. 347-351.

Riggs, "Optical Limiting Properties of Suspended and Solubilized Carbon Nanotubes," J. Phys. Chem. B 2000, 104, pp. 7071-7076.

Riggs, "Strong Luminescence of Solubilized Carbon Nanotubes", J. Am. Chem. Soc. 2000, 122, pp. 5879-5880.

Rinzler, "Large-Scale Purification of Single-Wall Carbon Nanotubes: Process, Product, and Characterization," Applied Physics A 67, pp. 29-37 (1998).

Rueckes, T., et al., "Carbon Nanotube-Based Nonvolatile Random Access Memory for Molecular Computing", Science, vol. 289, Issue 5476, Jul. 7, 2000, pp. 94-97.

Servalli, G. "A 45nm Generation Phase Change Memory. Technology," IEDM 2009 Technical Digest, pp. 5.7.1-5.7.4.

Shelimov et al., "Purification of single-wall carbon nanotubes by ultrasonically assisted filtration," Chemical Physics Letters, vol. 282, pp. 429-434, Jan. 23, 1998.

Snow, E.S. et al., "Random networks of carbon nanotubes as an electronic material," Applied Physics Letters, vol. 82, No. 13, Mar. 31, 2003, pp. 2145-2147.

Sotiropoulou, S. et al., "Carbon nanotube array-based biosensor", Anal. Bioanal. Chem, vol. 375, pp. 103-105, 2003.

Star, "Preparation and Properties of Polymer-Wrapped Single-Walled Carbon Nanotubes," Agnew Che. Int. Ed. 2001, 40, No. 9, pp. 1721-1725.

Star, A. et al., "Nanoelectronic Carbon Dioxide Sensors," Adv. Mater. 2004, 16, No. 22, Nov. 18, pp. 2049-2052.

Star, A. et al., "Nanotube Optoelectronic Memory Devices," Nano Letters, 2004, vol. 4, No. 9, pp. 1587-1591.

Sun, "High Dissolution and Strong Light Emission of Carbon Nanotubes in Aromatic Amine Solvents," 2001 American Chemical Society, J. Am. Chem. Soc., pp. 5348-5349.

Sun, "Soluble Dendron-Functionalized Carbon Nanotubes: Preparation, Characterization, and Properties," Che. Mater, 2001, 13, pp. 2864-2869.

TIPO's Search Report for ROC Patent Application No. 094118087 (English Translation).

Valentini, L. et al., "Sensors for Sub-ppm $NO_2$ Gas Detection Based on Carbon Nanotube Thin Films," *Applied Physics Letters*, 2003, vol. 82(6), pp. 961-963.

Vivekchand, "A New Method of Preparing Single-Walled Carbon Nanotubes," Proc. Indian Acad. Sci (Chem. Sci.), vol. 115, Nos. 5 & 6, Oct.-Dec. 2003, pp. 509-518.

Zhang et al., "Formation of metal nanowires on suspened signel-walled carbon nanotubes", *Appl. Phys. Lett.*, vol. 77, p. 3015, Nov. 2000, pp. 3015-3017.

Zhang, Y. et al., "Metal coating on suspended carbon Nanotubes and its implication to metal-tube interaction", Chemical Physics Letters, vol. 331, pp. 35-41, 2000.

Zhang, Z. et al.,"Select Pathways to Carbon Nanotube Film Growth", Advanced Materials, 13, No. 23, pp. 1761-1770, 2001.

Zhao, Y. P. et al., Frequency-dependent electrical transport in carbon nanotubes, Physical Review B., vol. 64, pp. 201402-1 to 201402-4, 2001.

Zhou, Y. et al., "p-Channel, n-Channel Thin Film Transistors and p-n Diodes Based on Single Wall Carbon Nanotube Networks," Nano Letters, 2004, vol. 4, No. 10, pp. 2031-2035.

Amblard, G., "Development and characterization of carbon nanotube processes for NRAM technology," Proc. of SPIE 2011, vol. 7970, pp. 797017-1-797017-7.

Brock, et al., "Carbon Nanotube Memories and Fabrics in a Radiation Hard Semiconductor Foundry," 2005 IEEE Conference, 9 pages.

Rosendale, et al., "A 4 Megabit Carbon Nanotube-based Nonvolatile Memory (NRAM)," ESSCIRC 2010 Proceedings, pp. 478-481.

Ward, et al., "A Non-Volatile Nanoelectromechanical Memory Element Utilizing a Fabric of Carbon Nanotubes," IEEE 2004, pp. 34-38.

\* cited by examiner

Bis (Trimethoxy silyl methyl) Benzene

Aminopropyltriethoxysilane (APTS)

ANISOTROPIC NANOTUBE FABRIC LAYERS AND FILMS AND METHODS OF FORMING SAME

CROSS-REFERENCE TO RELATED APPLICATIONS

This application is related to the following U.S. patents, which are assigned to the assignee of the present application, and are hereby incorporated by reference in their entirety:

Methods of Nanotube Films and Articles (U.S. Pat. No. 6,835,591), filed Apr. 23, 2002;

Methods of Using Pre-Formed Nanotubes to Make Carbon Nanotube Films, Layers, Fabrics, Ribbons, Elements, and Articles (U.S. Pat. No. 7,335,395), filed Jan. 13, 2003;

Devices Having Horizontally-Disposed Nanofabric Articles and Methods of Making the Same (U.S. Pat. No. 7,259,410), filed Feb. 11, 2004;

Non-Volatile Electromechanical Field Effect Devices and Circuits Using Same and Methods of Forming Same (U.S. Pat. No. 7,115,901), filed Jun. 9, 2004;

Patterned Nanowire Articles on a substrate and Methods of Making Same (U.S. Pat. No. 7,416,993), filed Sep. 8, 2004;

Devices Having Vertically-Disposed Nanofabric Articles and Methods of Making Same (U.S. Pat. No. 6,924,538), filed Feb. 11, 2004;

Resistive Elements Using Carbon Nanotubes (U.S. Pat. No. 7,365,632), filed Sep. 20, 2005; and Spin-Coatable Liquid for Formation of High Purity Nanotube Films (U.S. Pat. No. 7,375,369), filed Jun. 3, 2004.

This application is related to the following patent applications, which are assigned to the assignee of the application, and are hereby incorporated by reference in their entirety:

Anisotropic Nanotube Fabric Layers and Films and Methods of Forming Same (U.S. patent application Ser. No. (TBA)), filed on even date herewith;

Methods of Making Carbon Nanotube Films, Layers, Fabrics, Ribbons, Elements, and Articles (U.S. patent application Ser. No. 10/341,005), filed Jan. 13, 2003;

High Purity Nanotube Fabrics and Films (U.S. patent application Ser. No. 10/860,332), filed Jun. 3, 2004;

Two-Terminal Nanotube Devices and Systems and Methods of Making Same (U.S. patent application Ser. No. 11/280,786), filed Nov. 15, 2005;

Nanotube Articles with Adjustable Electrical Conductivity and Methods of Making Same (U.S. patent application Ser. No. 11/398,126), filed Apr. 5, 2006;

Nonvolatile Nanotube Diodes and Nonvolatile Nanotube Blocks and Systems Using Same and Methods of Making Same (U.S. patent application Ser. No. 11/835,856), filed Aug. 8, 2008;

Carbon Nanotubes for the Selective Transfer of Heat From Electronics (U.S. patent application Ser. No. 12/066,063), filed Mar. 6, 2008; and Microstrip Antenna Elements and Arrays Comprising a Shaped Nanotube Layer and Integrated Two Terminal Nanotube Select Devices (U.S. patent application No. TBA) filed on even date herewith.

TECHNICAL FIELD

The present invention relates generally to nanotube fabric layers and films and, more specifically, to anisotropic nanotube fabrics layers and films and methods of forming same.

BACKGROUND

Any discussion of the related art throughout this specification should in no way be considered as an admission that such art is widely known or forms part of the common general knowledge in the field.

Nanotube fabric layers and films are used in a plurality of electronic structures, and devices. For example, U.S. patent application Ser. No. 11/835,856 to Bertin et al., incorporated herein by reference in its entirety, teaches methods of using nanotube fabric layers to realize nonvolatile devices such as, but not limited to, block switches, programmable resistive elements, and programmable logic devices. U.S. Pat. No. 7,365,632 to Bertin et al., incorporated herein by reference in its entirety, teaches the use of such fabric layers and films within the fabrication of thin film nanotube based resistors. U.S. patent application Ser. No. 12/066,063 to Ward et al., incorporated herein by reference in its entirety, teaches the use of such nanotube fabrics and films to form heat transfer elements within electronic devices and systems. U.S. patent application entitled "Microstrip Antenna Elements and Arrays Comprising a Shaped Carbon Nanotube Layer and Integrated Two Terminal Nanotube Select Devices," filed on even date with the present disclosure (U.S. patent application No. not yet assigned) teaches the use of such nanotube fabrics and films in the fabrication of microstrip antenna elements and arrays.

Through a variety of previously know techniques (described in more detail within the incorporated references) nanotube elements can be rendered conducting, non-conducting, or semi-conducting before or after the formation of a nanotube fabric layer or film, allowing such nanotube fabric layers and films to serve a plurality of functions within an electronic device or system. Further, in some cases the electrical conductivity of a nanotube fabric layer or film can be adjusted between two or more non-volatile states as taught in U.S. patent application Ser. No. 11/280,786 to Bertin et al., incorporated herein by reference in its entirety, allowing for such nanotube fabric layers and films to be used as memory or logic elements within an electronic system.

U.S. Pat. No. 7,334,395 to Ward et al., incorporated herein by reference in its entirety, teaches a plurality of methods for forming nanotube fabric layers and films on a substrate element using preformed nanotubes. The methods include, but are not limited to, spin coating (wherein a solution of nanotubes is deposited on a substrate which is then spun to evenly distribute said solution across the surface of said substrate), spray coating (wherein a plurality of nanotube are suspended within an aerosol solution which is then disbursed over a substrate), and in situ growth of nanotube fabric (wherein a thin catalyst layer is first deposited over a substrate and then used to form nanotubes). Further, U.S. Pat. No. 7,375,369 to Sen et al., incorporated herein by reference in its entirety, teaches a nanotube solution which is well suited for forming a nanotube fabric layer over a substrate element via a spin coating process.

Within the current state of the art, there is an increasing need for nanotube fabric layers and films which are relatively thin, highly transparent, and possess a low uniform sheet resistance. Further, there is also a need for such nanotube fabrics layers and films to possess minimal voids (gaps or spaces between the individual nanotube elements) such as to provide substantially uniform electrical and mechanical properties throughout the nanotube fabric layer and film. To this end, it would be advantageous if methods were developed such that nanotube fabric layers and films could be readily formed in an anisotropic state. That is, if such nanotube fabric layers and films could be formed such that the individual nanotube elements within said layers and films were all oriented in substantially the same direction. In this way, very dense nanotube fabric layers and films could be realized with said layers and films possessing substantially uniform electrical characteristics and relatively low sheet resistance. Further, such nanotube fabric layers and films could be formed using minimal layers, maximizing the optical transparency through said fabric layers and films.

SUMMARY OF THE DISCLOSURE

The current invention relates to the formation of anisotropic nanotube fabrics and films.

In particular, the present disclosure provides a method of forming an anisotropic nanotube fabric layer over a substrate element. The method can include first suspending a first plurality of nanotube elements within a solvent to form a nanotube application solution. The method further can include rendering the nanotube application solution into a nematic state. The method further can include applying the nanotube application solution over the substrate element.

The present disclosure also relates to a method of forming an anisotropic nanotube fabric layer over a substrate element. The method can include first suspending a plurality of nanotube elements within a solvent to form a nanotube application solution. The method further can include flowing the nanotube solution through a nozzle element to form a stream of aligned nanotube elements. The method further can include projecting the stream of aligned nanotube elements onto the substrate element.

The present disclosure also provides a method of forming an anisotropic nanotube fabric layer over a substrate element. The method can include first suspending a plurality of nanotube elements within a solvent to form a nanotube application solution. The method further can include flowing the nanotube solution through a nozzle element to form a stream of aligned nanotube elements. The method further can include electrically charging the aligned nanotube elements as the aligned nanotube elements are passed through the nozzle element. The method further can include projecting the stream of aligned nanotube elements through at least one electrical field and onto the substrate element. The method can further include moving the substrate element relative to the nozzle element during the step of projecting to form a shaped layer of nanotube elements. In some embodiments, the nanotube elements are carbon nanotubes. In some embodiments, the nozzle element can moved in relation to said substrate element during the step of projecting such as to form a shaped nanotube fabric layer. In some embodiments, the substrate can be flexible.

The present disclosure also provides a method of forming an anisotropic nanotube fabric layer over a substrate element. The method can include first forming a layer of a nanotube adhesion averter material over the substrate element. The method further can include depositing a photoresist mask over the layer of nanotube adhesion averter material such that at least one region of the layer of nanotube adhesion averter material is covered by the photoresist mask and at least one region of the layer of nanotube adhesion averter material is not covered by the photoresist mask. The method further can include etching away the at least one region of the layer of nanotube adhesion averter material not covered by the photoresist mask to form at least one gap within the layer of nanotube adhesion averter material. The method further can include backfilling the at least one gap within the layer of nanotube adhesion averter material with a nanotube adhesion promoter material to form at least one nanotube adhesion structure. The method further can include stripping away the photoresist mask to leave a patterned application surface comprising the remaining nanotube adhesion averter material and the at least one nanotube adhesion structure. The method further can include depositing a layer of nanotube elements over the patterned application surface. The method further can include washing the layer of nanotube elements such that substantially all nanotube elements not in physical contact with the at least one nanotube adhesion structure are removed.

According to one aspect of the present disclosure, anisotropic nanotube fabrics and films are formed by rendering a nanotube application solution into a nematic state prior to the application of the solution over a substrate element. In some embodiments, the nematic state is achieved by increasing the concentration of nanotube elements in solution. In some embodiments the concentration of nanotube elements can be increased by adding nanotube elements or removing a volume of the solvent. In some embodiments, the concentration can be increased from about 0.005/ml to about 0.05 g/ml.

In some embodiments, the nanotube layer can be applied by spraying, dip coating, or spin coating. In some embodiments, the substrate can be flexible. In some embodiments, the layer of nanotube adhesion averter material can be a self assembled monolayer.

In some embodiments, the layer of nanotube adhesion averter material can be bis (trimethoxy silyl methyl) benzene. In some embodiments, the photoresist mask can be deposited in a predetermined pattern over said layer of nanotube adhesion averter material. In some embodiments, the step of etching can be performed via a reactive plasma etch process. In some embodiments, the nanotube adhesion promoter material can be aminopropyltriethoxysilane. In some embodiments, the nanotube adhesion structures can be narrow with respect to the substrate element. In some embodiments, the nanotube adhesion structures can range in width from about 1 nm to about 10 nm. In some embodiments, the patterned application surface can be substantially planar.

In some embodiments, the layer of nanotube elements can be applied via a dip coating process. In some embodiments, the dip coating process can use an air-liquid interface. In some embodiments, the dip coating process can use a liquid-liquid interface. In some embodiments, the dip coating process can use a nanotube application solution including nanotube elements.

In some embodiments, the concentration of the nanotube elements can be optimized to promote the formation of an anisotropic nanotube fabric layer over said at least one nanotube adhesion structure. In some embodiments, the nanotube application solution can be rendered into a nematic state to promote the formation of an anisotropic nanotube fabric layer over said at least one nanotube adhesion structure. In some embodiments, the nematic state can include a concentration of the nanotube elements in said nanotube application solution is greater than 0.05 g/ml.

In some embodiments, the speed of the dip coating process can be optimized to form an anisotropic nanotube fabric layer over said at least one nanotube adhesion structure. In some embodiments, the speed of the dip coating process can be in the range of about 5.4 microns/second to about 54 microns/second. In some embodiments, the ambient temperature during the dip coating process can be optimized to form an anisotropic nanotube fabric layer over said at least one nanotube adhesion structure. In some embodiments, the ambient temperature can be room temperature. In some embodiments, the layer of nanotube elements can be applied via a spin coating process. In some embodiments, the layer of nanotube elements can be applied via a spray coating process.

In some embodiments, the substrate element can be selected from the group consisting of a silicon wafer, semiconductors, plastic, glass, a flexible polymer, a flexible substrate, and a transparent substrate. In some embodiments, the thickness of the nanotube fabric layer can be about 50 nm to about 200 nm.

Under another aspect of the present disclosure, anisotropic nanotube fabrics and films are formed using flow induced alignment of individual nanotube elements as they are deposited onto a substrate element.

Under another aspect of the present disclosure, anisotropic nanotube fabrics and films are formed using nanotube adhesion promoter materials are used to form a patterned nanotube adhesion surface.

Other features and advantages of the present disclosure will become apparent from the following description of the disclosure which is provided below in relation to the accompanying drawings.

DETAILED DESCRIPTION

Figure 1A:
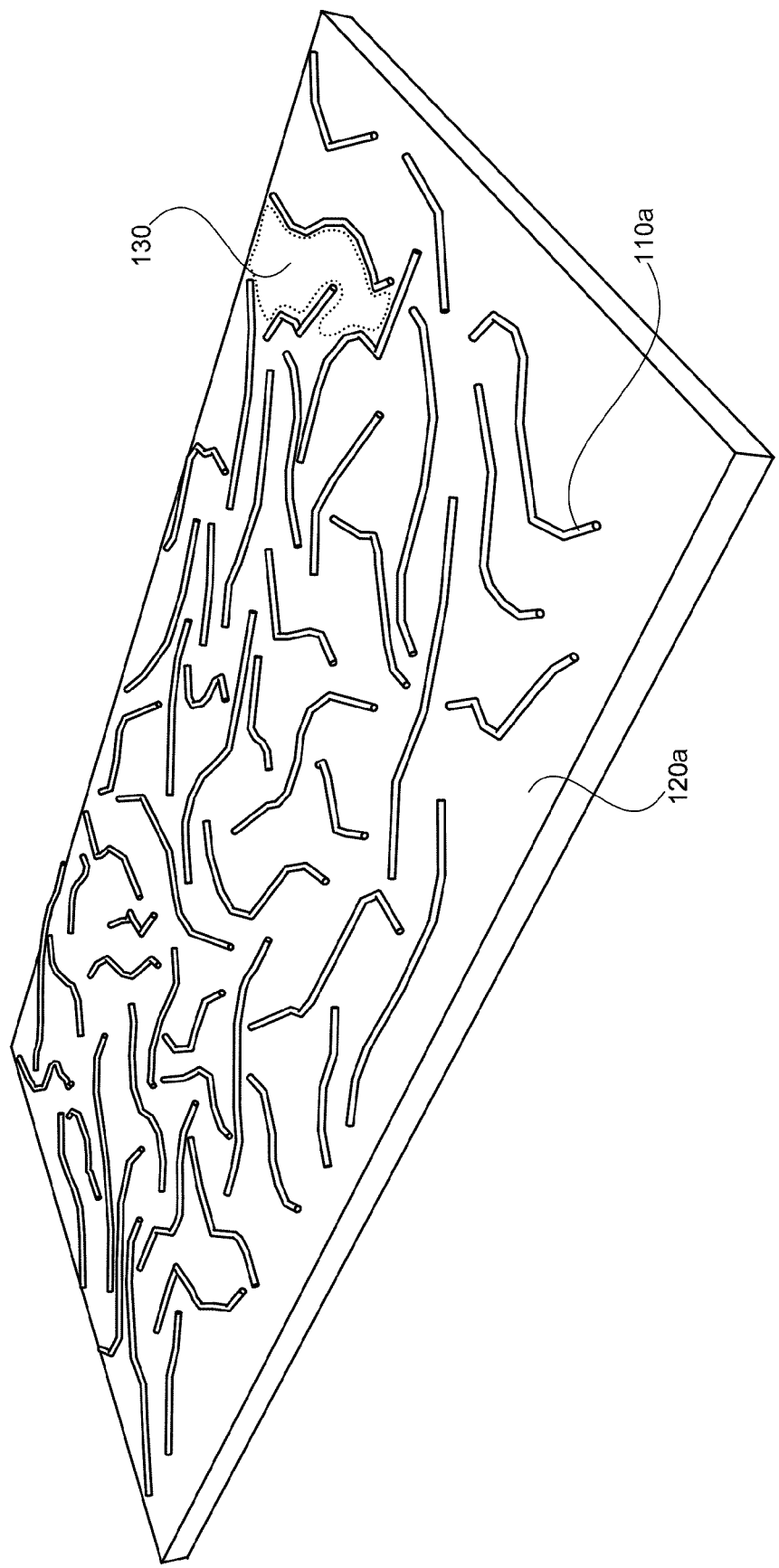
FIG. 1A is a perspective drawing illustrating an exemplary isotropic nanotube fabric layer.

FIG. 1A illustrates an isotropic nanotube fabric layer created with previously known methods (as discussed in detail within the incorporated references). A plurality of nanotube elements 110a are dispersed randomly in a single layer over substrate element 120a. The orientation (with respect to the plane of the nanotube fabric layer) of the individual nanotube elements 110a is random, resulting in a plurality of gaps or voids 130 within the nanotube fabric layer. These gaps 130 lead to non-uniform electrical characteristics across the nanotube fabric layer, and in some cases multiple layers are required to achieve desired electrical characteristics (such as, but not limited to, low sheet resistance and directional conductivity) within the nanotube fabric layer.

Figure 1B:
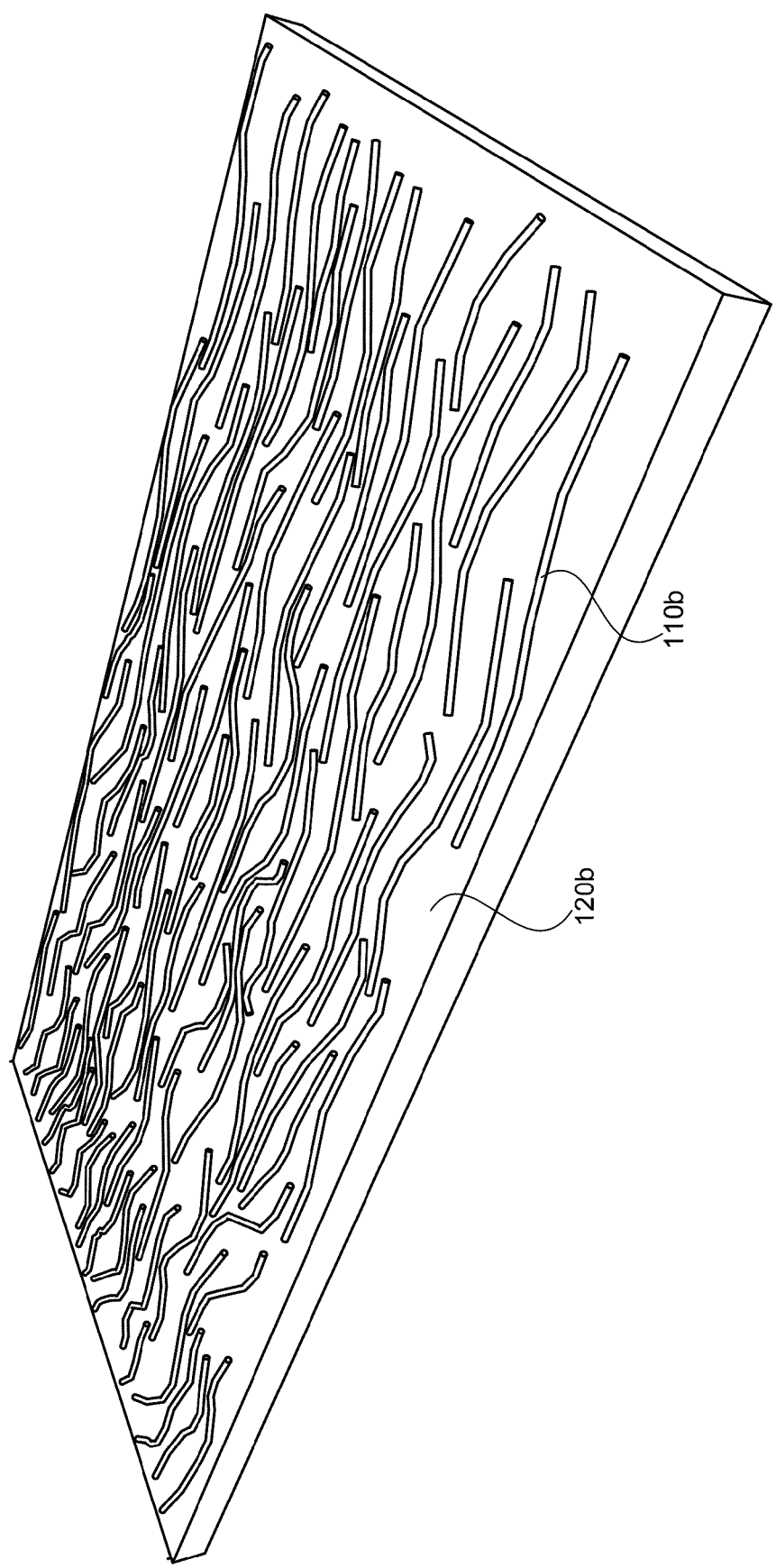
FIG. 1B is a perspective drawing illustrating an exemplary anisotropic nanotube fabric layer.

FIG. 1B illustrates an anisotropic nanotube fabric layer formed via the methods of the present disclosure. Within the exemplary nanotube fabric layer depicted in FIG. 1B, a plurality of nanotube elements 110b are distributed over substrate element 120b such that substantially all of the individual nanotube elements 110b are oriented in the same direction within the plane of the fabric layer, forming an anisotropic nanotube fabric. It should be noted that gap regions 130 present in the isotropic nanotube fabric layer depicted in FIG. 1A have been minimized in the anisotropic nanotube fabric depicted in FIG. 1B.

Figure 2:
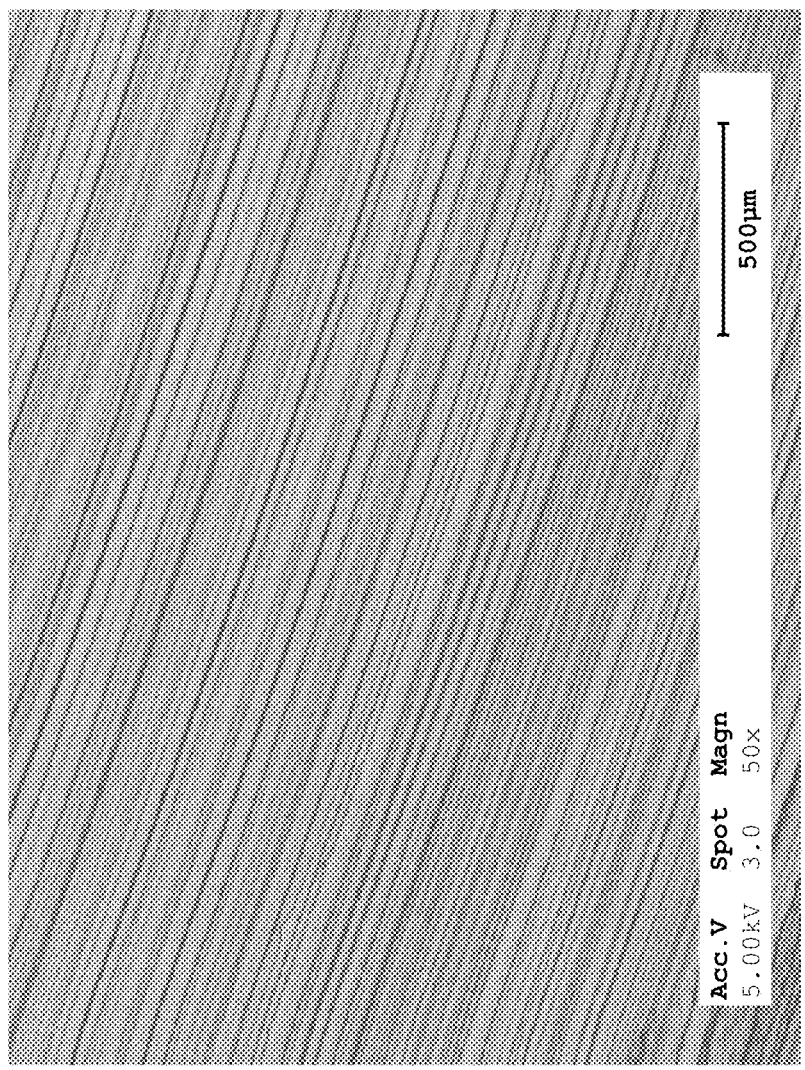
FIG. 2 is a SEM image of an anisotropic nanotube fabric layer formed via the methods of the present disclosure.

FIG. 2 is a TEM image of an anisotropic nanotube fabric layer formed via the methods of the present disclosure which corresponds to the exemplary fabric layer depicted in FIG. 1B.

In one aspect of the present disclosure, anisotropic nanotube fabrics are realized by using a nanotube application solution which has been rendered into a nematic (or liquid crystalline) phase. Flory-Huggins solution theory—a mathematical model describing the thermodynamics of polymer solutions which is well known to those skilled in the art—teaches that for a solution comprising a substantially rigid (that is, inflexible) solute suspended within a solvent, said solution can be made to undergo a phase change from isotropic to nematic as the concentration of said solution is increased. That is, by increasing the volume density (or concentration) of a solute within a solvent, a solution may be rendered into a nematic phase.

U.S. Pat. No. 7,375,369 to Sen et al., incorporated herein by reference in its entirety, teaches a nanotube application solution (that is, a volume of pristine nanotube elements suspended in a solvent) which is well suited to forming a nanotube fabric layer via a spin coating operation. The individual nanotube elements (the solute within the nanotube application solution) within such a solution are rigid with a substantially large length to diameter ratio. Further, the concentration of nanotube elements within such a solution can be easily controlled (by introducing a plurality of additional individual nanotube elements, for example, or by removing a volume of the solvent). Taking advantage of Flory-Huggins solution theory, the concentration of such an application solution—that is the volume density of nanotube elements suspended within the solvent liquid—can be manipulated such as to render the application solution into a nematic (or liquid crystalline) phase. This nematic application solution can then be applied to a substrate element via a spin coating process to form an anisotropic nanotube layer (as depicted in FIG. 1B and FIG. 2).

Figure 3B:
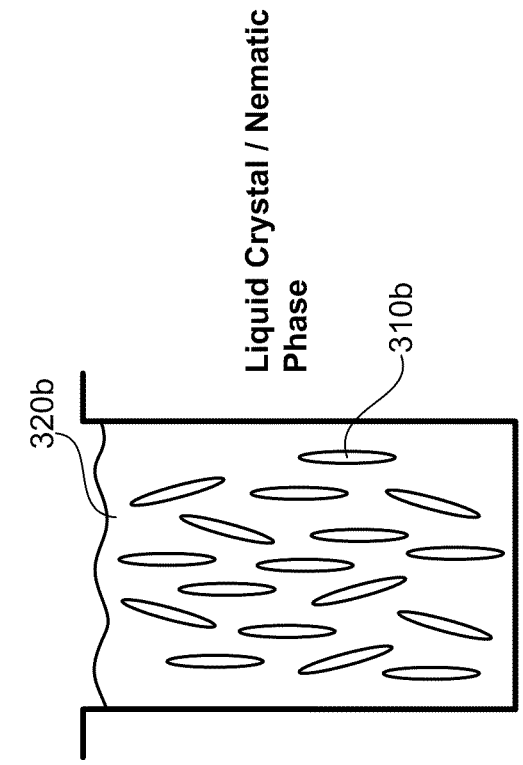
FIG. 3B is an illustration depicting a solution in a nematic (or liquid crystalline) phase, according to one embodiment of the present disclosure.
Figure 3A:
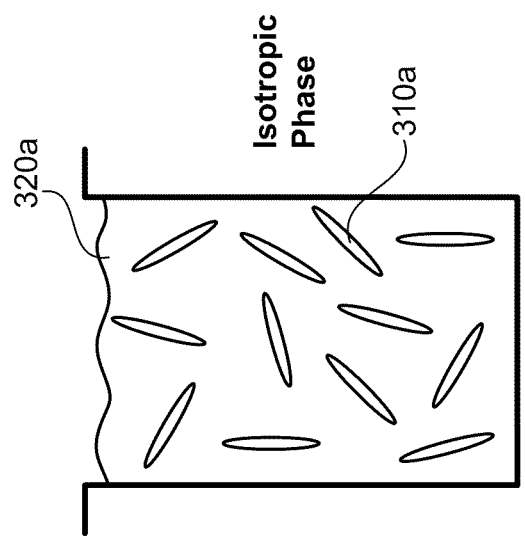
FIG. 3A is an illustration depicting a solution in an isotropic phase.

FIGS. 3A-3B illustrate the technique (as taught by Flory-Huggins solution theory) of varying the concentration of an exemplary solution to realize a phase change within said solution from isotropic to nematic. The isotropic solution depicted in FIG. 3A is comprised of a plurality of particles 310a suspended within a solvent 320a. It should be noted that the particles 310a within the isotropic solution depicted in FIG. 3A show no uniformity in orientation. FIG. 3B illustrates an exemplary solution in a nematic (or liquid crystalline) phase. As in FIG. 3A, the solution depicted in FIG. 3B is comprised of a plurality of particles 310b suspended within solvent 320b. Within the solution depicted in FIG. 3B, the increased density of particles 310b within the solvent 320b has caused said particles 310b to self align, rendering the solution into a nematic (or liquid crystalline) phase.

As known to those skilled in the art, Flory-Huggins solution theory teaches that the critical concentration (c) required to render a solution of rigid rods—that is a plurality of rigid rods dissolved within a solvent, as depicted in FIGS. 3A and 3B—into a biphasic state—that is, a state where in isotropic and nematic phases are in equilibrium—is given by:

$$c = 3.3 \rho D/L$$

where:
$\rho$ = the density of said rigid rod elements
D = the diameter of said rigid rod elements
L = the length of the said rod elements Within a typical exemplary carbon nanotube application solution, individual carbon nanotube elements might possess the following parameters:
$\rho$ = ~1.75 g/ml
D = 1-2 nm
L = 200 nm-1000 nm Thus, for such a carbon nanotube application solution, the critical concentration of nanotube elements required to form a biphasic system (that is, the threshold between an isotropic phase and nematic phase) can range from approximately 0.005 g/ml to approximately 0.05 g/ml, with a typical concentration being 0.01 g/ml. Further, to render such a carbon nanotube application solution into a nematic state, the concentration of nanotube elements in the solution should be increased from a level less than approximately 0.005 g/ml to a level greater than 0.05 g/ml.

It should be noted that while the preceding example (intended to illustrate an exemplary process of rendering an exemplary nanotube application solution into a nematic state) provides specific concentration ranges for an exemplary nanotube application solution, the methods of the present disclosure are not limited in this regard. Indeed, the specific values used within the preceding example are not intended to represent concentration ranges specific to all nanotube application solutions, as such concentration ranges will be dependant on a plurality of parameters including, but not limited to, the density, diameter, and length of the individual nanotube elements suspended within an application solution.

Figure 4:
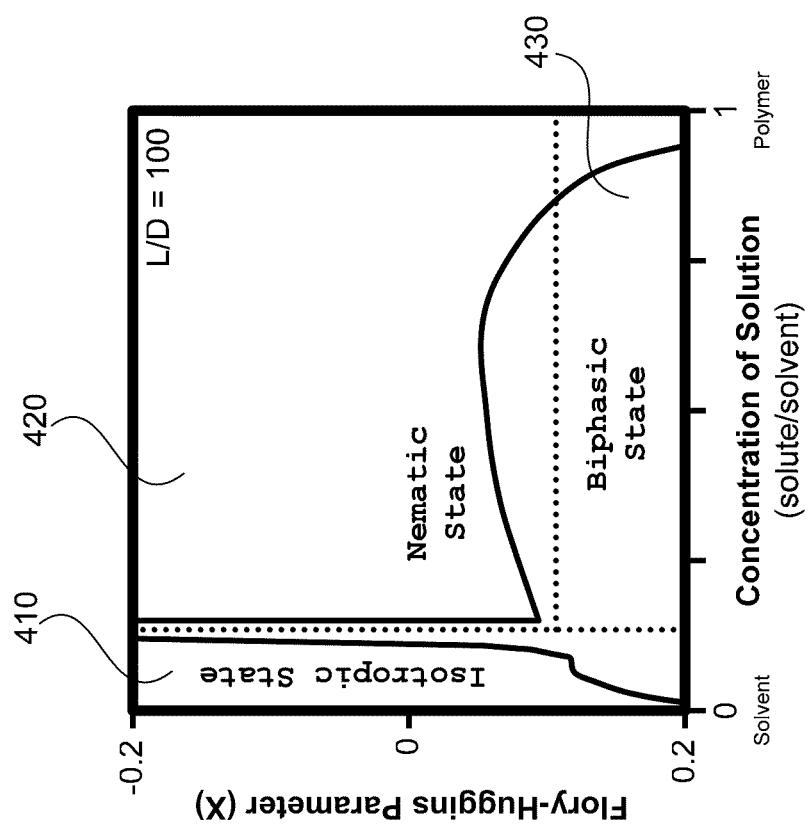
FIG. 4 is a graph plotting the Flory-Huggins parameter (X) against the concentration of a solution wherein the solute elements within said solution possess a length to diameter ratio (L/D) on the order of 100.

FIG. 4 is a graph illustrating the phase change of an exemplary nanotube application solution as the concentration of said solution is varied. Within the exemplary nanotube application solution, the individual nanotube elements all possess a length to diameter ratio (L/D) of substantially 100. The graph depicted in FIG. 4 plots the Flory-Huggins interaction parameter (X) against the concentration of said exemplary nanotube application solution in order to illustrate where a phase change (from isotropic to nematic) occurs. The Flory-Huggins interaction parameter (X)—sometimes referred to as "the heat of mixing"—is well known to those skilled in the art and is a useful indicator within Flory-Huggins solution theory in describing phase changes of solutions.

The graph depicted in FIG. 4, shows three distinct regions: an isotropic region 410, wherein said exemplary solution is rendered into an isotropic state; a nematic region 420, wherein said exemplary solution is rendered into a nematic state; and a biphasic region 430, where said exemplary solution is rendered in a mixed isotropic and nematic state. By varying the concentration of said exemplary solution such that it remains within the nematic region 420 of the graph depicted in FIG. 4, said exemplary solution will be rendered into a nematic phase. A fabric realized through a spin coat application of such a nematic solution will result in a substantially anisotropic nanotube fabric layer.

It should be noted that while the graph of FIG. 4 illustrates a specific concentration range useful for rendering a specific exemplary nanotube application solution into a nematic phase, the present invention is not limited in this regard. Indeed, a graph such as is depicted in FIG. 4 is dependent on a plurality of parameters including, but not limited to, the L/D of the individual nanotube elements, the temperature of the solution, and the type of solvent used. It is preferred, therefore, that the methods of the present invention are not limited to this specific example presented.

In another aspect of the present disclosure an anisotropic nanotube fabric layer is formed via flow induced alignment of individual nanotube elements.

Figure 5:
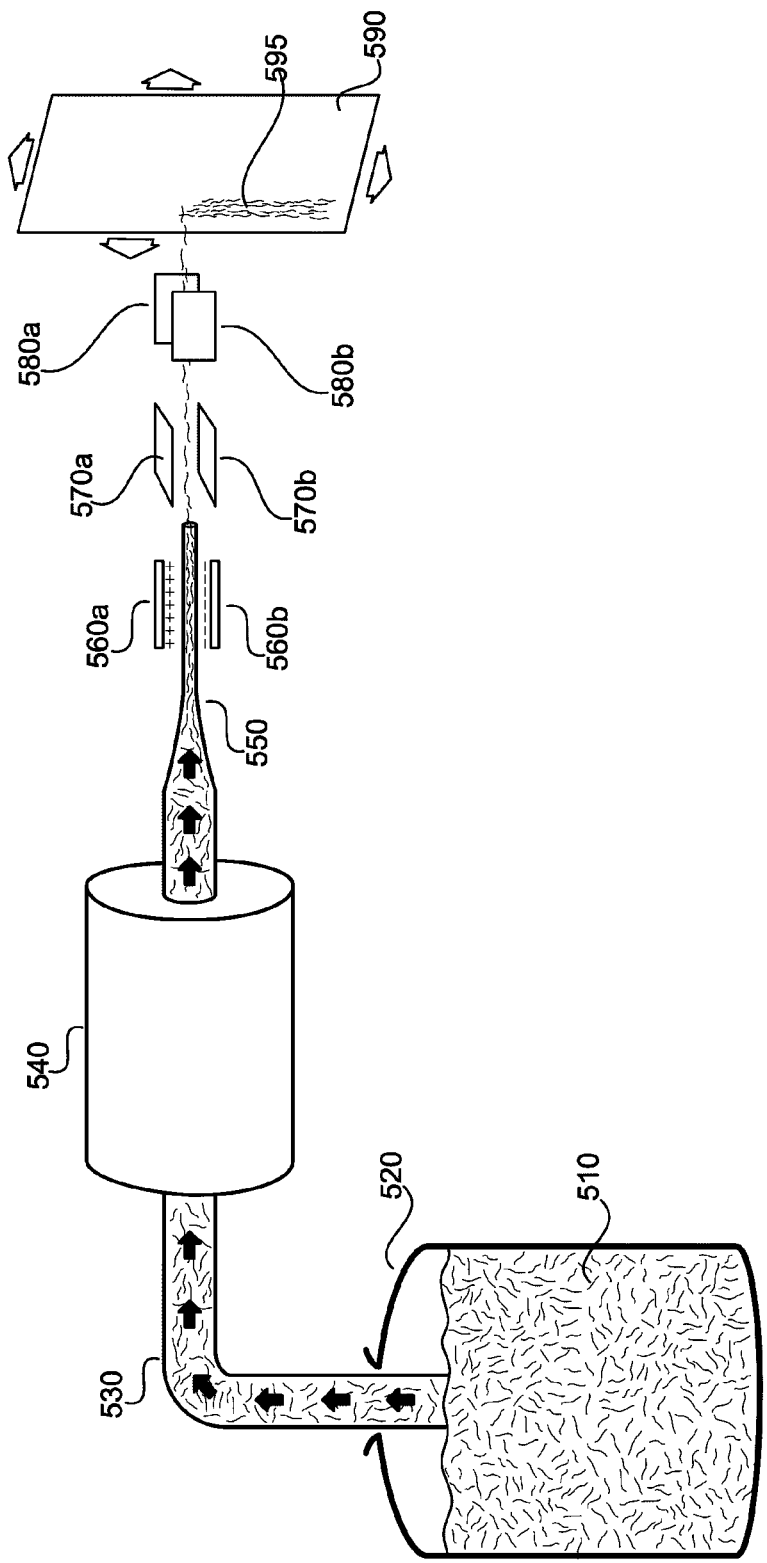
FIG. 5 is a simplified perspective drawing of a nanotube application system which includes a nozzle assembly, according to one embodiment of the present disclosure.

FIG. 5 illustrates a simplified diagram of a nanotube application system which provides a method of forming an anisotropic nanotube fabric layer in a predetermined pattern over the surface of a substrate element. Supply tank 520 contains a plurality of individual nanotube elements 510 suspended in an application solution. Pump structure 540 draws said application solution (along with individual nanotube elements 510) up through intake tube 530 and provides same to nozzle structure 550. As individual nanotube elements 510 flow through nozzle structure 550, they are forced into a uniform orientation, substantially matching the orientation of nozzle structure 550.

In an embodiment of this aspect of the present disclosure, as individual nanotube elements 510 are forced through nozzle structure 550, said individual nanotube elements 510 are charged, for example by passing the nanotube elements 510 between charging plates 560a and 560b. The nanotube elements 510 can be charged by any means known to one of skill in the art to charge nanotube elements. Individual nanotube elements 510 exit nozzle assembly 550 at sufficient velocity as to pass between horizontal deflection plates 570a and 570b, vertical deflection plates 580a and 580b, and finally deposit themselves on substrate element 590, forming nanotube fabric layer 595. Although vertical and horizontal deflection plates are both shown in FIG. 5, the nanotube elements can be charged through either a horizontal or a vertical plate, or plates having any other alignment. As the individual nanotube elements 510 are aligned prior to their exiting nozzle assembly 550, nanotube fabric layer 595 will tend to be anisotropic as all nanotube elements 510 deposited onto substrate element 590 will be oriented in substantially the same direction. In some embodiments, wherein individual nanotube elements 510 are aligned substantially parallel to nozzle assembly 550, a circular nozzle would be employed. In other embodiments, wherein individual nanotube elements 510 are aligned substantially perpendicular to nozzle assembly 550, oval or slotted nozzles would be employed.

Electrical energy can provided (through additional circuitry not shown in FIG. 5 for the sake of clarity) to horizontal deflection plates 570a and 570b and vertical deflection plates 580a and 580b such as to provide electric fields of variable magnitude. These two electrical fields are used to deflect the charged individual nanotube elements 510 in the horizontal and vertical directions, respectively. In this way, an individual nanotube element 510 can be deposited onto a specific point on substrate element 590 within a given radius without moving substrate element 590 or nozzle assembly 550 (this may be described as a "fine" targeting adjustment to the stream of nanotube elements 510 being applied to substrate element 590). Additionally, substrate element 590 can be moved in any direction orthogonal to nozzle assembly 550 (as shown in FIG. 5) in order to form anisotropic nanotube fabric layer 595 in a desired pattern (this may be described as a "coarse" targeting adjustment to the stream of nanotube elements 510 being applied to substrate element 590).

In another embodiment, deflection plates 570a and 570b or 580a and 580b are used to rotate the alignment of the nanotubes before deposition on the substrate, creating deposition that is no longer parallel to the nanotubes originating form nozzle 550. This is accomplished by inducing a high electric field between the plates, which will rotate the alignment of the nanotubes from parallel to perpendicular.

It should be noted that in some embodiments of this aspect of the present disclosure, the substrate element 590 may remain fixed in space and for the nozzle structure 550 (along with charging plates 560a and 560b, horizontal deflection plates 560a and 560b, and vertical deflection plates 580a and 580b) to move to provide "coarse" targeting adjustments. Further, it should also be noted that in some embodiments of this aspect of the present disclosure, charging plates 560a and 560b, horizontal charging plates 570a and 570b, and vertical charging plates 580a and 580b are not used. In such embodiments, no "fine" targeting adjustment to the stream of nanotube elements 510 is used.

Figure 6:
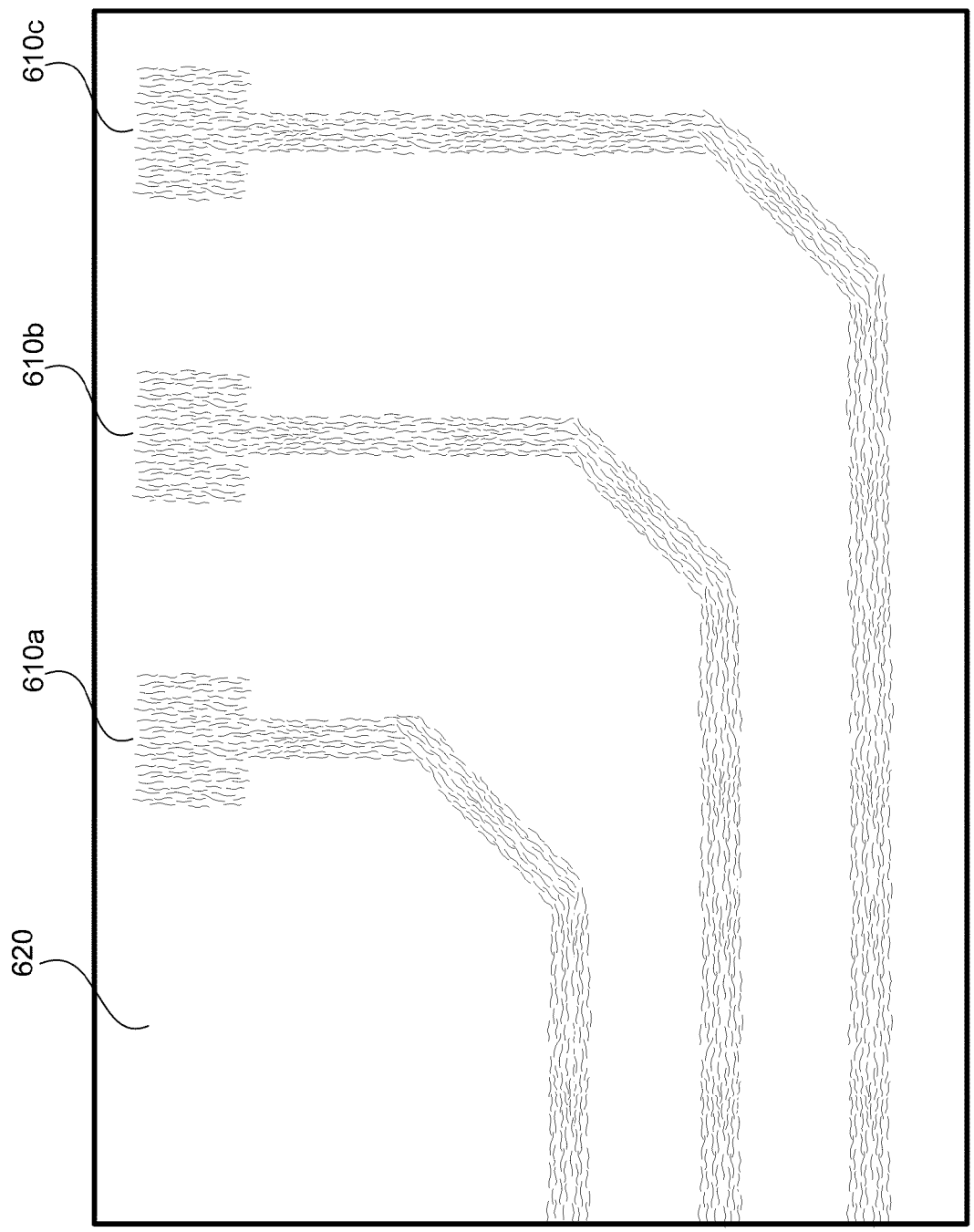
FIG. 6 is a perspective drawing of an exemplary nanotube fabric formed via the nanotube application system of FIG. 5.

FIG. 6 illustrates an exemplary anisotropic nanotube fabric formed via the nanotube application system depicted in FIG. 5. Three shaped traces 610a, 610b, and 610c are formed over substrate element 620. Each of the shaped traces 610a, 610b, and 610c is an anisotropic nanotube fabric layer formed to a desired geometry and orientation without the need for patterning or etching techniques. In this way, highly conductive—and, in some embodiments, highly transparent—electrical traces can be formed rapidly over a substrate element. Such a technique can be useful in the fabrication of touch screen applications (which generally require conductive grids to be overlain on display elements) and solar cells The nanotube fabric layer can be a single layer or a multilayer aligned fabric. Exemplary thicknesses of the single layer fabric can range from about 50 nm to about 150 nm, while the multilayer fabric thicknesses can range from about 75 nm to about 200 nm.

In another aspect of the present disclosure anisotropic nanotube fabric layers are realized using adhesion promoter materials formed into narrow strips over a substrate.

Figure 7B:
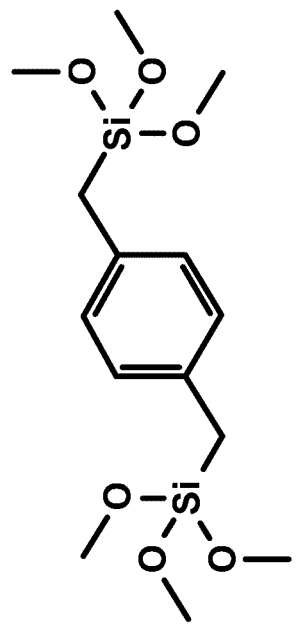
FIG. 7B is a chemical structure diagram of bis (trimethoxy silyl methyl) benzene.
Figure 7A:
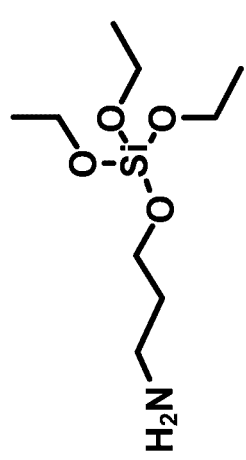
FIG. 7A is a chemical structure diagram of aminopropyl-triethoxysilane (APTS)

FIG. 7A depicts the structural chemical diagram of aminopropyltriethoxysilane (APTS), a material which promotes the adhesion of carbon nanotube elements. As depicted in FIG. 7A, APTS is comprised of two groups: an oxysilane group which adheres readily to a silicon wafer (as would be used in a standard semiconductor fabrication process); and an amino group ($H_2N$—) which adheres readily to carbon nanotube elements. As will be shown in subsequent figures, a layer of APTS may be applied in a desired pattern over a substrate element and used to form an anisotropic nanotube fabric layer.

FIG. 7B depicts the structural chemical diagram of bis (trimethoxy silyl methyl) benzene, which tends to avert the adhesion of carbon nanotube elements. As with APTS (depicted in FIG. 7A), bis (trimethoxy silyl methyl) benzene comprises a pair of oxysilane groups which adhere readily to silicon wafers. However the remaining group—the benzene ring—does not readily adhere to carbon nanotube elements.

As will be shown in subsequent figures (and in the discussion of same), a layer of bis (trimethoxy silyl methyl) benzene can be formed over a substrate element and used to prevent the formation of a nanotube fabric layer.

Specifically, for carbon nanotubes functionalized with —COOH groups in an aqueous medium three classes of surface modifiers can be used as adhesion promoters: protic basic (which promote adhesion due to interaction with the acidic groups on carbon nanotubes), aprotic basic, and polar aprotic.

The following is a list of exemplary materials which are well suited for use as adhesion promoters as taught by the present disclosure. It should be noted that the following list is not inclusive of all adhesion promoter materials suitable for use with the methods of the present disclosure. Indeed, the following list is intended only to provide a non-limiting list of exemplary adhesion promoter materials:

Protic Basic Promoters:
    3-aminopropyl triethoxy silane (APTS)
    Bis (3-trimethoxysilylpropyl) amine
    Bis (2-hydroxyethyl)-3-aminopropyl-triethoxysilane
    N-butylaminopropyl trimethoxysilane Aprotic Basic Promoters:
    3-(N,N-dimethylaminopropyl)-trimethoxysilane
    N-n-butyl-aza-2,2-dimethoxysilacyclopentane Polar Aprotic Promoters:
    acetoxypropyltrimethoxysilane
    (N-acetylglycyl)-3-aminopropyl trimethoxy silane
    Benzoyloxypropyl trimethoxy silane Similarly, the following is a list of exemplary materials which are well suited for use as adhesion averters as taught by the present disclosure. It should be noted that the following list is not inclusive of all adhesion averter materials suitable for use with the methods of the present disclosure. Indeed, the following list is intended only to provide a non-limiting list of exemplary adhesion averter materials:

bis (trimethoxy silyl ethyl) benzene
    Hexamethyl disilazane (HMDS)
    octadecyl trichlorosilane (OTS)

Figure 8:
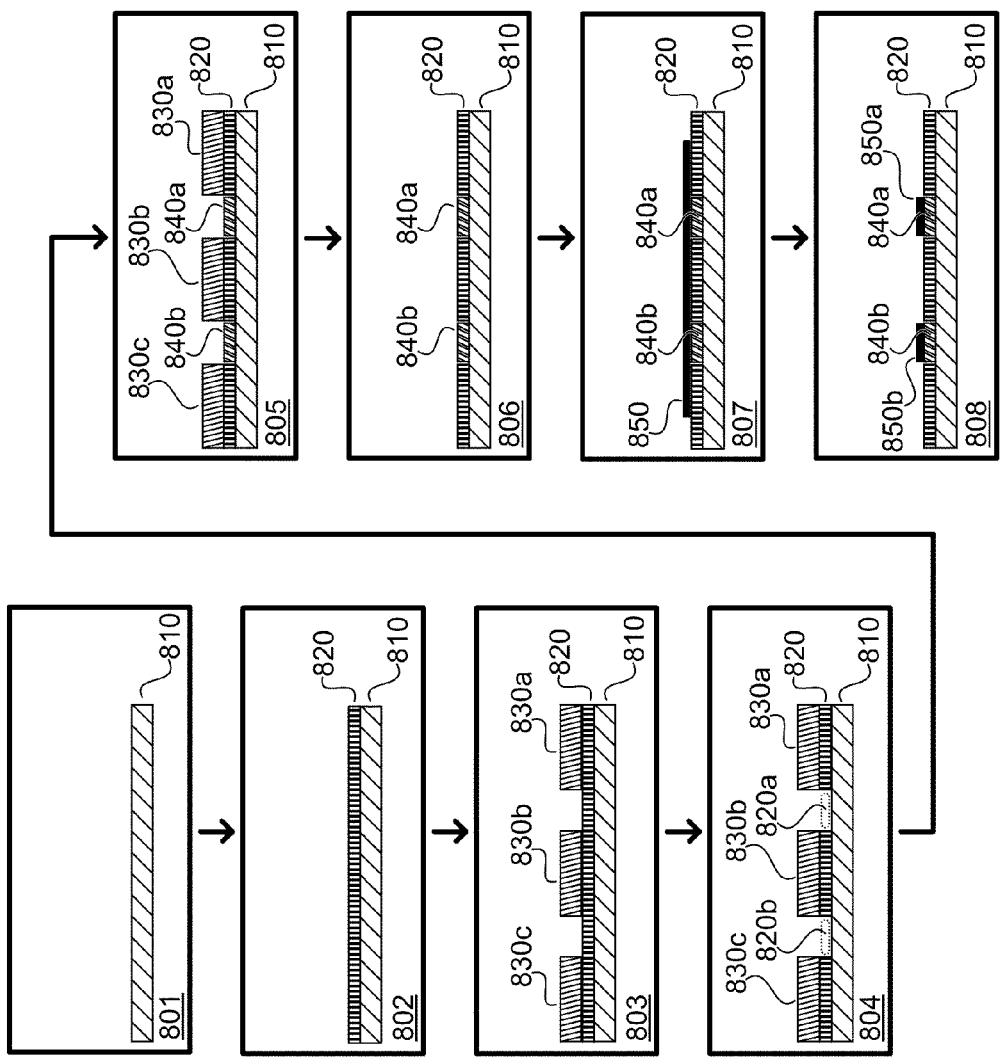
FIG. 8 is a fabrication process diagram illustrating a method of nanotube fabric formation using adhesion promoter materials, according to one embodiment of the present disclosure.

FIG. 8 is a fabrication process diagram illustrating a method of forming anisotropic nanotube fabric layers using a combination of a nanotube adhesion promoter material—such as, but not limited to, APTS—and a nanotube adhesion averter material—such as, but not limited to, bis (trimethoxy silyl methyl) benzene to form a patterned application surface.

In first process step 801, a substrate element 810 is provided. In a second process step 802, a self assembled monolayer of a nanotube adhesion averter material 820—such as, but not limited to, bis (trimethoxy silyl methyl) benzene—is deposited over substrate element 810. In a third process step 803, photoresist blocks 830a, 830b, and 830c are deposited in a predetermined pattern over nanotube adhesion averter material monolayer 820. In a fourth process step 804, an etch process—such as, but not limited to, an oxygen plasma etch process—is used to remove those areas of nanotube adhesion averter material monolayer 820 not covered by photoresist blocks 830a, 830b, and 830c, forming gaps 820a and 820b. In a fifth process step 805, gaps 820a and 820b are backfilled with an adhesion promoter material—such as, but not limited to, APTS—to form nanotube adhesion structures 840a and 840b. In a sixth process step 806, photoresist blocks 830a, 830b, and 830c are stripped away.

Figure 9:
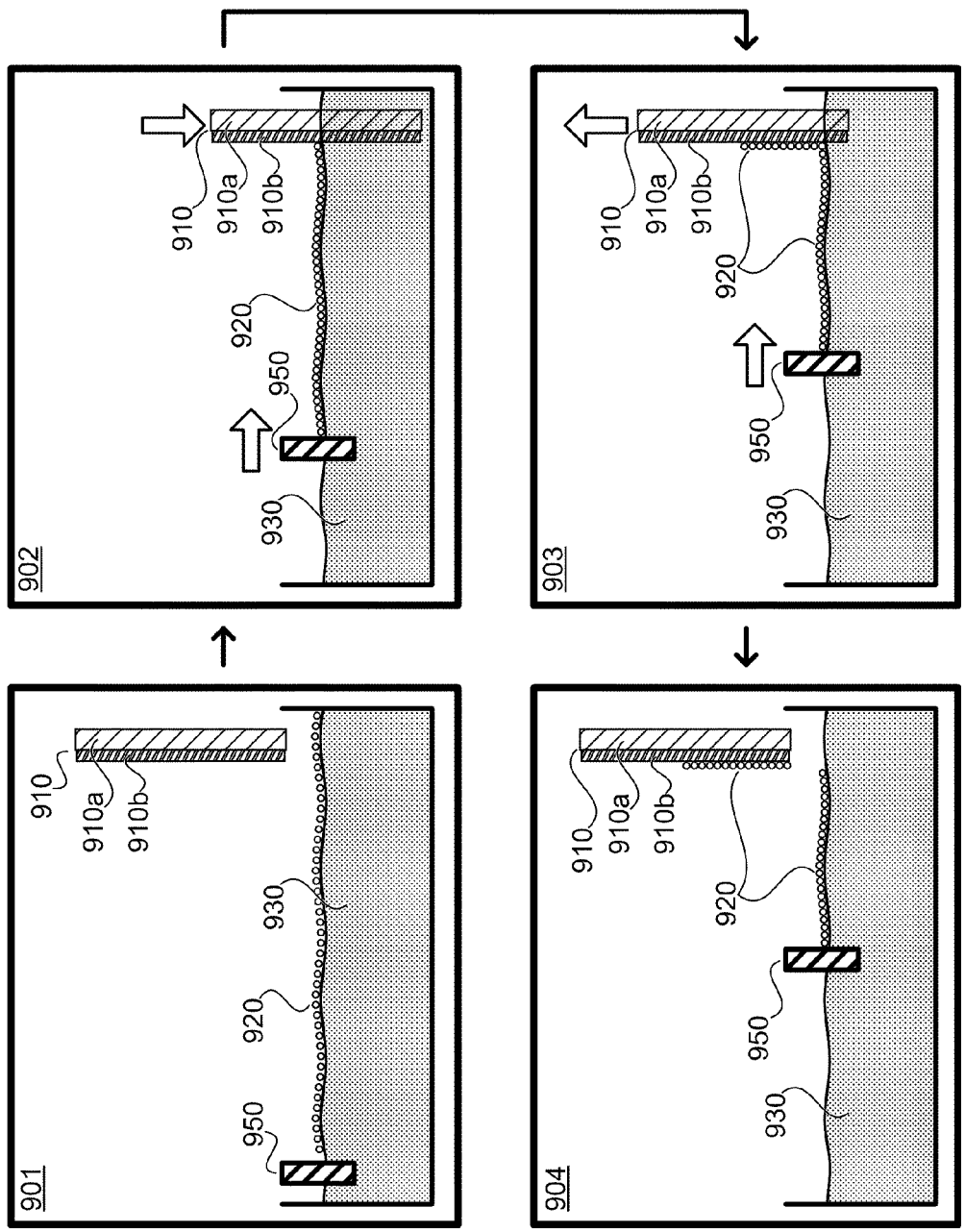
FIG. 9 is a fabrication process diagram illustrating an air-liquid interface dip coating process, according to one embodiment of the present disclosure.
Figure 10:
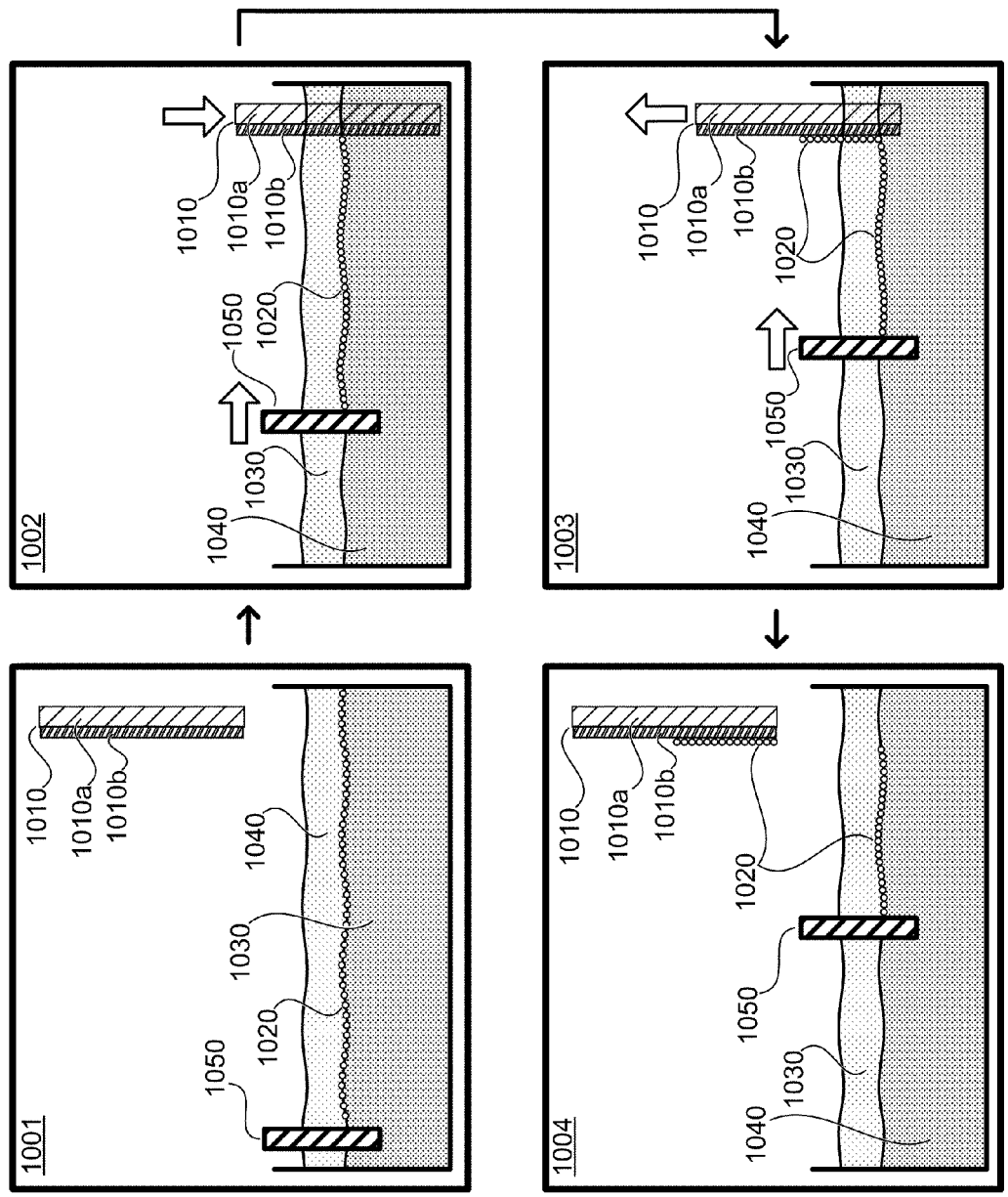
FIG. 10 is a fabrication process diagram illustrating a liquid-liquid interface dip coating process, according to one embodiment of the present disclosure.
Figure 11:
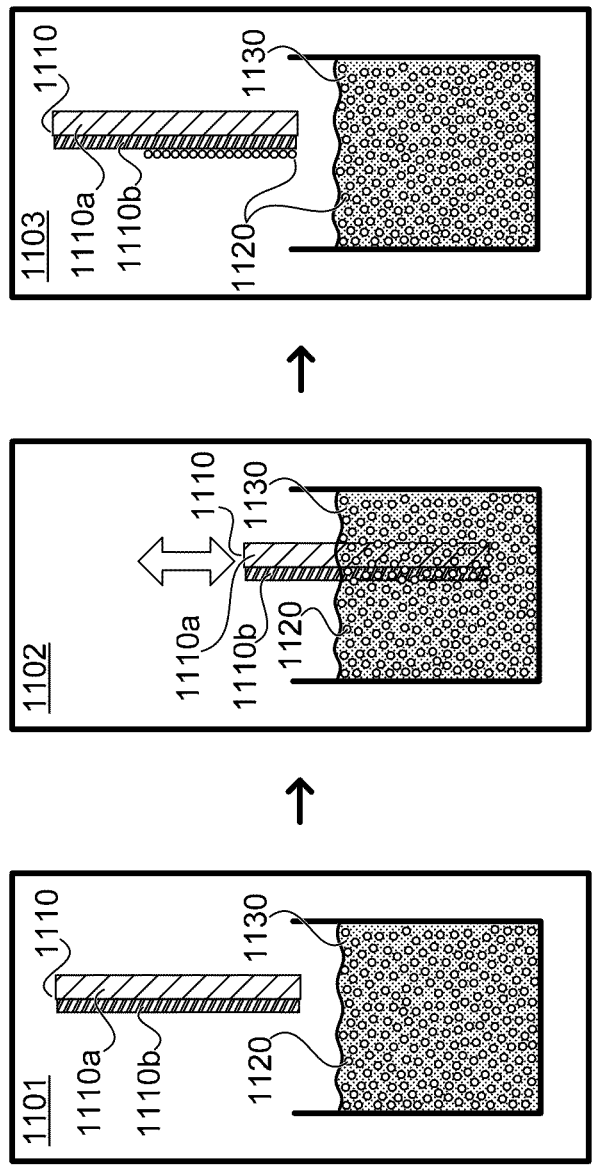
FIG. 11 is a fabrication process diagram illustrating a nanotube solution dip coating process, according to one embodiment of the present disclosure.

In a seventh process step 807, a layer of nanotube elements 850 is deposited over the surface of the patterned application surface formed by nanotube adhesion averter material monolayer 820 and nanotube adhesion structures 840a and 840b. In one embodiment, the nanotube elements are applied through a spray coating method described in FIG. 5. In an embodiment of this aspect of the present disclosure, a dip coating process can be used to apply the nanotube fabric layer. FIGS. 9, 10, and 11 illustrate exemplary dip coating processes suitable for applying the nanotube fabric layer 850. An exemplary dip coating processes will be described in detail in the discussion of those figures below. However, it should be noted that the methods of this aspect of the present disclosure are not limited to a dip coating process. Within the seventh process step 807 a plurality of other application methods could be employed to apply nanotube fabric layer 850 over the patterned application surface formed by nanotube adhesion averter material monolayer 820 and nanotube adhesion structures 840a and 840b. Such other application methods include, but are not limited to, spin coating and spray coating.

In an eighth and final process step 808, the entire assembly is washed and dried leaving nanotube fabric layers 850a and 850b over nanotube adhesion structures 840a and 840b only. The nanotube material deposited over nanotube adhesion averter material monolayer 820 is removed during the wash process as the nanotube material does not adhere to the monolayer 820.

Through the use of relatively narrow nanotube adhesion structures 840a and 840b within the patterned nanotube adhesion surface, the individual nanotube elements within nanotube fabric layers 850a and 850b will tend to self align and form anisotropic nanotube fabric layers as said individual nanotube elements are confined to only the regions of the patterned application surface containing the nanotube adhesion promoter material. For example, the nanotube adhesion structures can be about 1 nm to about 10 nm in width. The use of a carefully controlled dip coating process—wherein parameters such as, but not limited to, ambient temperature, volume density of nanotube elements in the dip coating solution, and the speed at which the substrate structure is inserted and removed from the dip coating solution are optimized—can also aid in the creation of these anisotropic nanotube fabric layers. Exemplary parameters for the dip coating processing include room temperature, a volume density in solution that correlates to between about an optical density of about 2.0 and dip coating pull rates of about 5.4 microns/second to about 54 microns/second. As discussed above, the fabric layers can be a single or multiple layer aligned nanotube fabric, having thicknesses ranging from about 50 nm to about 200 nm.

While the preceding discussion describes substrate element 810 as a silicon wafer (as would be typical in a semiconductor fabrication process), it should be noted that the methods of the present disclosure are not limited in this regard. Indeed, substrate element 810 could be formed from a plurality of materials including, but not limited to, semiconductors, plastic, transparent materials such as glass, optical glass, and quartz, indium-tin oxide films, and flexible polymeric/plastic substrates such as polyethylene terephthalate (PET), polyolefins, and polycarbonate. Further, the substrate can be a flexible substrate. Because of the flexible nature of the nanotube fabric, the nanotube fabric can be applied to a flexible substrate and the nanotube fabric can bend and flex with the flexible substrate without negatively affecting the performance or the operative lifetime of the nanotube fabric. Further, the fabrication method described in FIG. 8—and specifically the technique of using a nanotube adhesion promoter material such as APTS—allows for the formation of nanotube fabric layers (both anisotropic and isotropic) over a plurality of surfaces which do not readily adhere to nanotube fabrics alone.

Figure 12A:
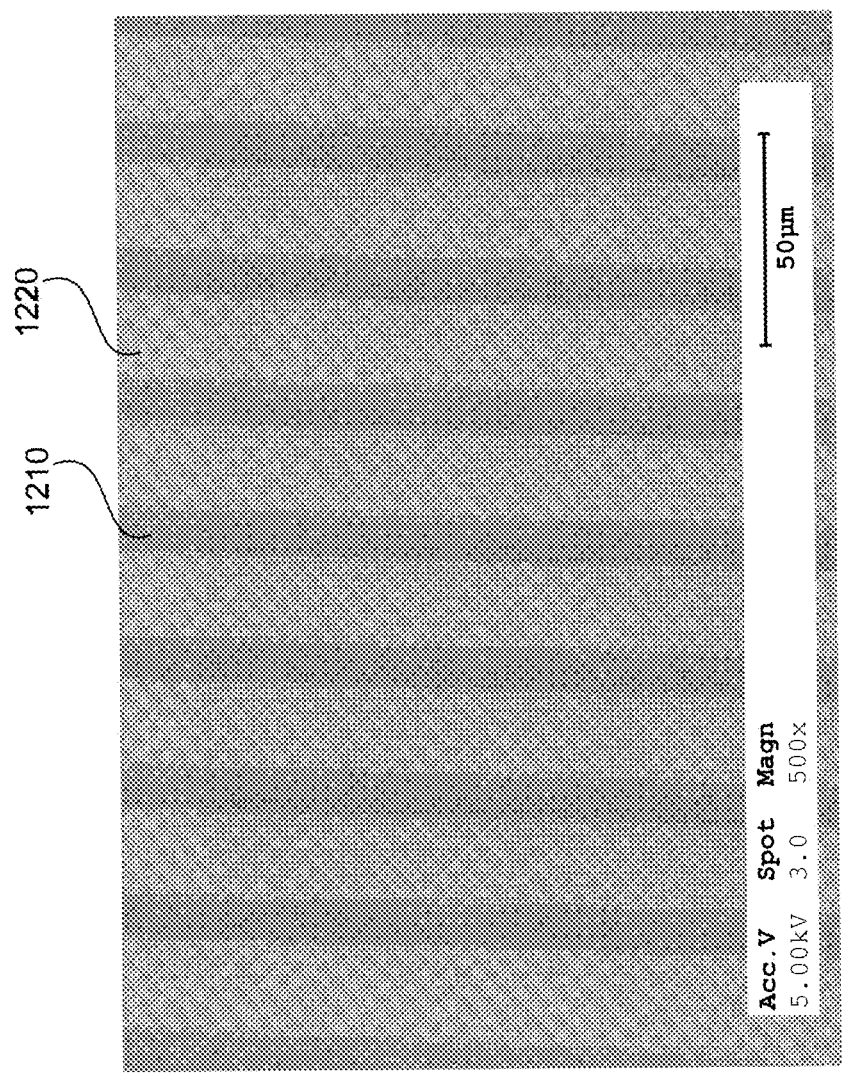
FIGS. 12A-12E are a series of SEM images (at increasing magnifications) of an anisotropic nanotube fabric layer formed via the methods of the present disclosure.

FIGS. 12A-12E are a series of SEM images (at increasing magnifications) of an anisotropic nanotube fabric layer formed via the fabrication method depicted in FIG. 8 and described in detail in the discussion of that figure. Referring to FIG. 12A, dark regions 1210 are narrow anisotropic nanotube fabric layers corresponding to anisotropic nanotube fabric layers 850a and 850b in FIG. 8. The wider light regions 1220 contain substantially no nanotube elements and correspond to nanotube adhesion averter material 820 in FIG. 8.

Figure 12B:
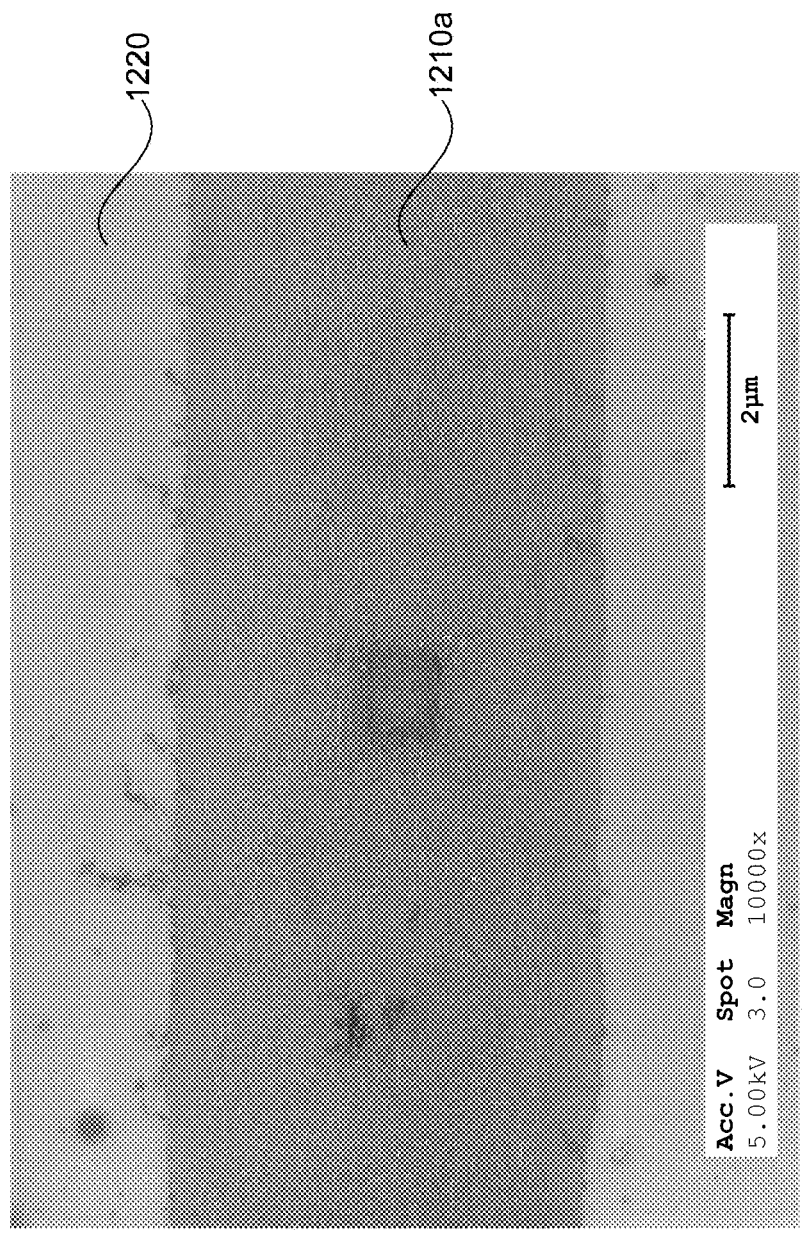

FIG. 12B, which increases the magnification of the structure depicted in FIG. 12A by a factor of twenty, provides a close up view of a single narrow anisotropic nanotube fabric layer 1210a. At the magnification level used in FIG. 12B, the individual nanotube elements within anisotropic nanotube fabric layer 1210a just begin to resolve into view, and the absence of such nanotube elements on the nanotube adhesion averter material 1220 is evident.

Figure 12C:
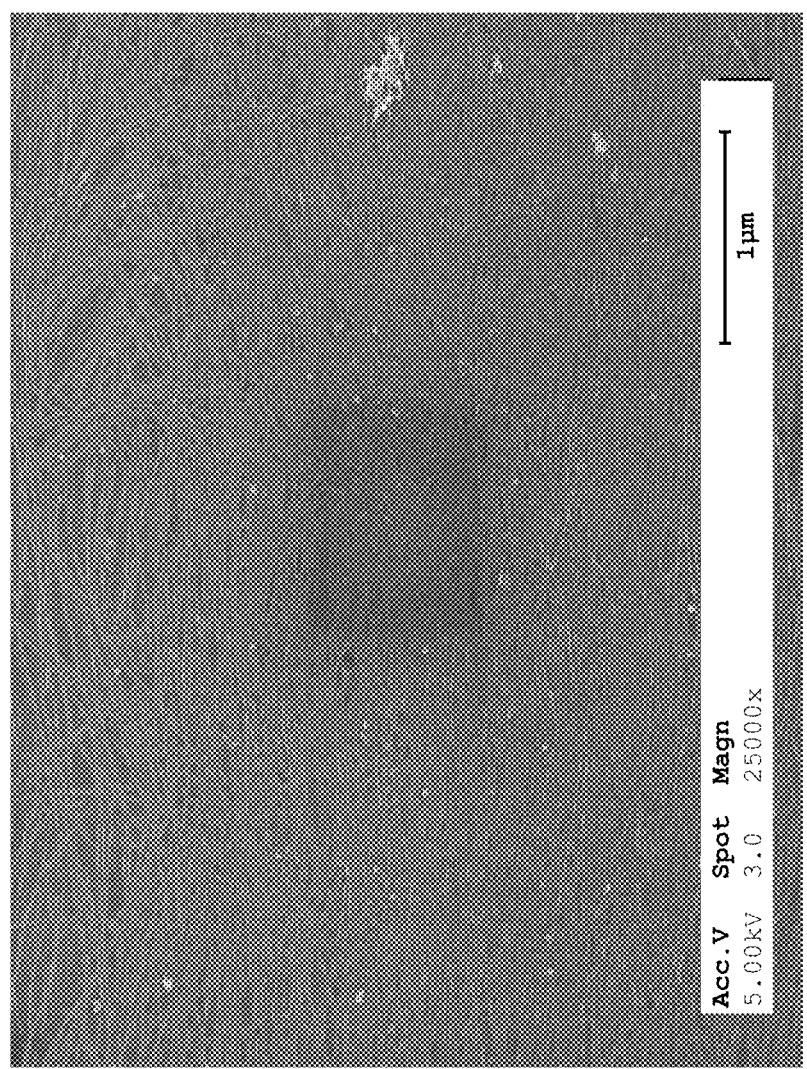
Figure 12D:
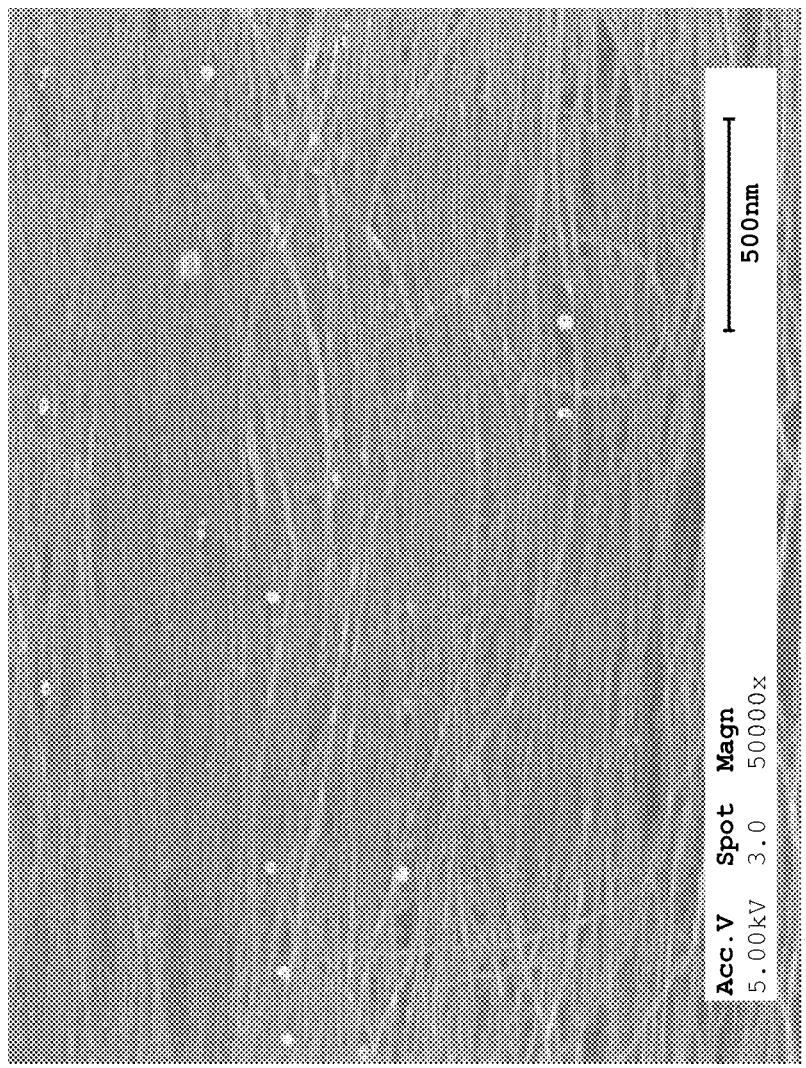
Figure 12E:
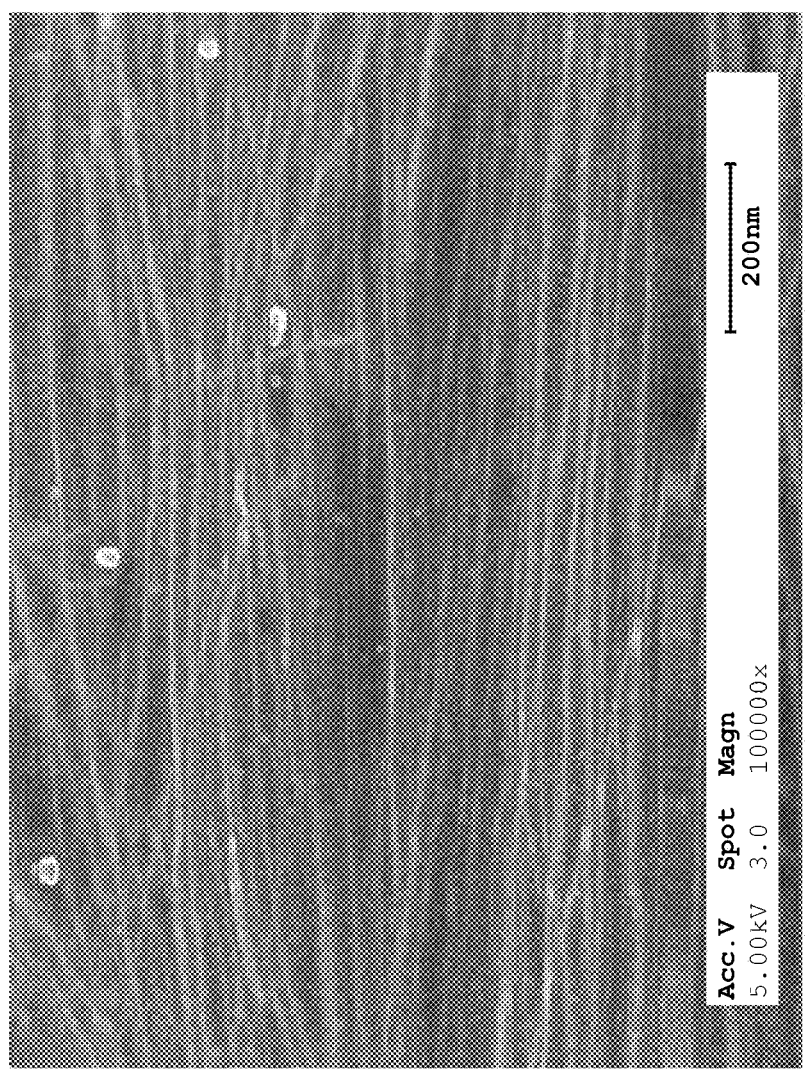

FIG. 12C increases the magnification of the structure depicted in FIG. 12B by a factor of 2.5, FIG. 12D increases the magnification of the structure depicted in FIG. 12B by a factor of 5, and FIG. 12E increases the magnification of the structure depicted in FIG. 12B by a factor of 10. Within these three TEM images (FIGS. 12C, 12D, and 12E) the aligned orientation of the individual nanotube elements in anisotropic fabric 1210a is evident.

FIG. 9 illustrates an air-liquid interface dip coating process suitable for use within the fabrication process illustrated in FIG. 8 and discussed in detail above. In a first process step 901, a plurality of nanotube elements 920 are deposited over the surface of a liquid 930. Substrate assembly 910—comprising substrate element 910a (which corresponds to substrate element 810 in FIG. 8) and patterned nanotube application layer 910b—is suspended above liquid 930. The apparatus used to suspend—and, in subsequent process steps, lower and raise—substrate assembly 910 is not shown in FIG. 9 for the sake of clarity. A guide apparatus 950 is positioned within the liquid 930 and, in subsequent process steps, is used to guide individual nanotube elements 920 toward and onto substrate assembly 910.

In a second process step 902, substrate assembly 910 is lowered into liquid 930 and guide apparatus 950 is used to compress the individual nanotube elements 920 floating over the surface of liquid 930 against the patterned nanotube application layer 910b. In a third process step 903, substrate assembly 910 is raised up from liquid 930 while guide apparatus 950 is simultaneously moved forward to continuously guide individual nanotube elements 920 toward and onto patterned nanotube application layer 910b. In a fourth and final process step 904, substrate assembly 910 is raised completely out of liquid 930, and an anisotropic nanotube fabric layer has been formed on the portion of substrate assembly 910 which was submerged within liquid 930. While the thickness of this anisotropic nanotube fabric layer will be dependant on a plurality of factors—such as, but not limited to, the speed of the dip coating process, the concentration of nanotube elements 920 floating on the surface of the liquid 930, and the materiel used to form patterned nanotube application layer 910b—in some embodiments, for example, the thickness of this anisotropic nanotube fabric layer can range between 1 nm to 1000 nm with some thicknesses ranging between about 50 nm to about 200 nm.

FIG. 10 illustrates a liquid-liquid interface dip coating process suitable for use within the fabrication process illustrated in FIG. 8 and discussed in detail above. In a first process step 1001, a plurality of nanotube elements 1020 are deposited over the surface of a first liquid 1030 and a second liquid 1040 is deposited over said plurality of nanotube elements 1020. The relative densities of the first liquid 1030 and the second liquid 1040 are such that the plurality of nanotube elements 1020 remain compressed between them.

Still referring to first process step 1001, substrate assembly 1010—comprising substrate element 1010a (which corresponds to substrate element 810 in FIG. 8) and patterned nanotube application layer 1010b—is suspended above second liquid 1040. The apparatus used to suspend—and, in subsequent process steps, lower and raise—substrate assembly 1010 is not shown in FIG. 10 for the sake of clarity. A guide apparatus 1050 is positioned within the second liquid 1040, extending partially into first liquid 1030. In subsequent process steps, guide apparatus 1050 is used to guide individual nanotube elements 1020 toward and onto substrate assembly 1010.

In a second process step 1002, substrate assembly 1010 is lowered into both first liquid 1030 and second liquid 1040. Guide apparatus 1050 is used to compress the individual nanotube elements 1020 compressed between first liquid 1030 and second liquid 1040 against the patterned nanotube application layer 1010b. In a third process step 1003, substrate assembly 1010 is raised up while guide apparatus 1050 is simultaneously moved forward to continuously guide individual nanotube elements 1020 toward and onto patterned nanotube application layer 1010b. In a fourth and final process step 1004, substrate assembly 1010 is raised completely out of first liquid 1030 and second liquid 1040, and an anisotropic nanotube fabric layer has been formed on the portion of substrate assembly 1010 which was submerged within first liquid 1030. While the thickness of this anisotropic nanotube fabric layer will be dependant on a plurality of factors—such as, but not limited to, the speed of the dip coating process, the concentration of nanotube elements 1020 compressed between first liquid 1030 and second liquid 1040, and the materiel used to form patterned nanotube application layer 1010b—in some embodiments, for example, the thickness of this anisotropic nanotube fabric layer can range from 1 nm to 1000 nm with some thicknesses ranging between about 50 nm to about 200 nm.

FIG. 11 illustrates a dip coating process using a nanotube solution suitable for use within the fabrication process illustrated in FIG. 8 and discussed in detail above. In a first process step 1101, a plurality of nanotube elements 1120 are suspended in nanotube solution 1130 (such nanotube solutions are described in detail within U.S. Pat. No. 7,375,369 to Sen et al., incorporated herein by reference in its entirety). Substrate assembly 1110—comprising substrate element 1110a (which corresponds to substrate element 810 in FIG. 8) and patterned nanotube application layer 1110b—is suspended above nanotube solution 1130. The apparatus used to suspend—and, in subsequent process steps, lower and raise—substrate assembly 1110 is not shown in FIG. 11 for the sake of clarity.

In a second process step 1102, substrate assembly 1110 is lowered into nanotube application solution 1130 and the individual nanotube elements 1120 suspended within nanotube application solution 1130 are allowed to come into physical contact with patterned nanotube application layer 1110b. In a third and final process step 1103, substrate assembly 1110 is raised completely out of nanotube application solution 1130, and an anisotropic nanotube fabric layer has been formed on the portion of substrate assembly 1110 which was submerged within nanotube application solution 1130. While the thickness of this anisotropic nanotube fabric layer will be dependant on a plurality of factors—such as, but not limited to, the speed of the dip coating process, the concentration of nanotube elements 1120 within nanotube application solution 1130, and the materiel used to form patterned nanotube application layer 1110b—in some embodiments, for example, the thickness of this anisotropic nanotube fabric layer can range from 1 nm to 1000 nm with some thicknesses ranging between about 50 nm to about 200 nm.

Figure 13A:
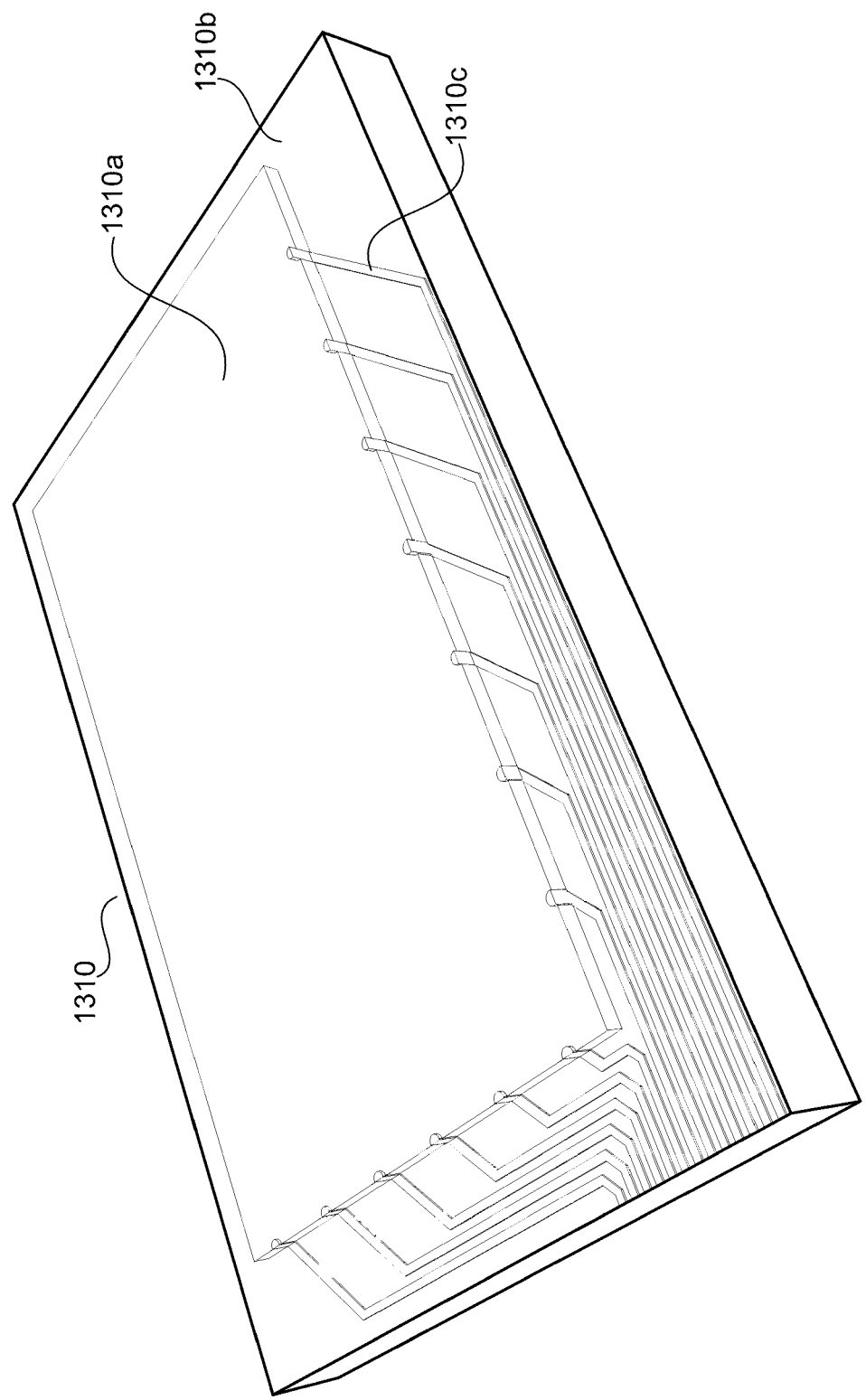
FIGS. 13A-13E are assembly diagrams depicting a touch screen device which includes isotropic nanotube fabric layers formed via the methods of the present disclosure.

FIGS. 13A-13E are assembly diagrams illustrating a touch screen device which includes a plurality of thin anisotropic nanotube fabric layers formed via the methods of the present disclosure. Referring to FIG. 13A, an electronic device assembly 1310 includes display screen element 1310a, electronics housing 1310b, and a plurality of conductive traces along the surface of electronics housing 1310b which provide contact points at evenly spaced intervals along two edges of display screen element 1310a. Electronic device assembly 1310 is intended to be an exemplary electronic device which is well known to those skilled in the art. Indeed, the base electronics assemblies for a plurality of commercial products such as, but not limited to, cellular telephones, commercial navigation systems, and electronic book readers are well represented by the simplified structure depicted as electronic device assembly 1310.

Figure 13B:
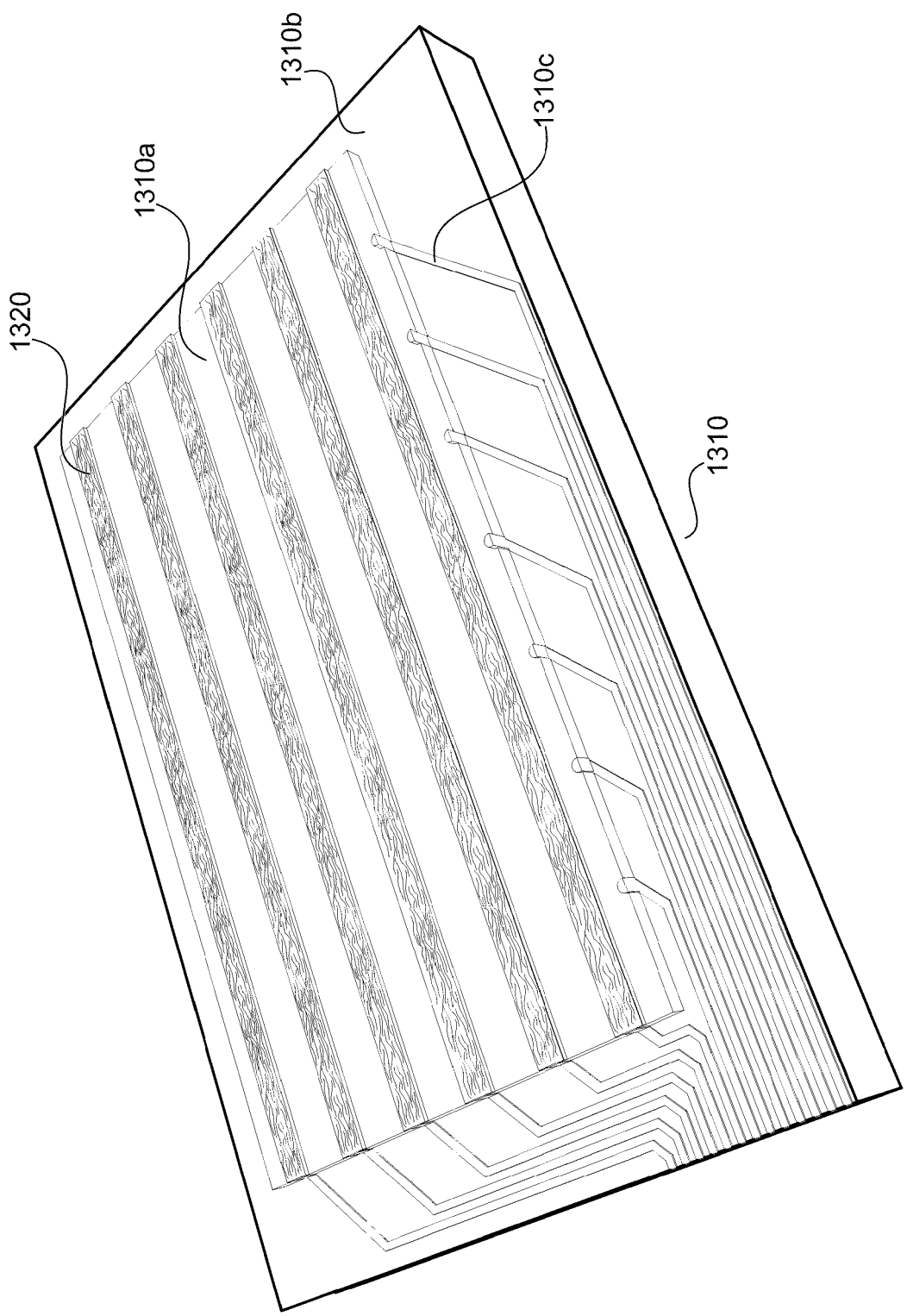

Referring now to FIG. 13B, a plurality of horizontally oriented anisotropic nanotube fabric articles 1320 are deposited over display screen element 1310a such that each horizontally oriented nanotube fabric article 1320 makes electrical contact with a trace element 1310c. As previously discussed, the present disclosure presents a plurality of methods for depositing such anisotropic nanotube fabric articles over a substrate element such as glass or plastic which would be used to faun display screen element 1310a. Such methods are depicted in previous figures and discussed in detail above.

Figure 13C:
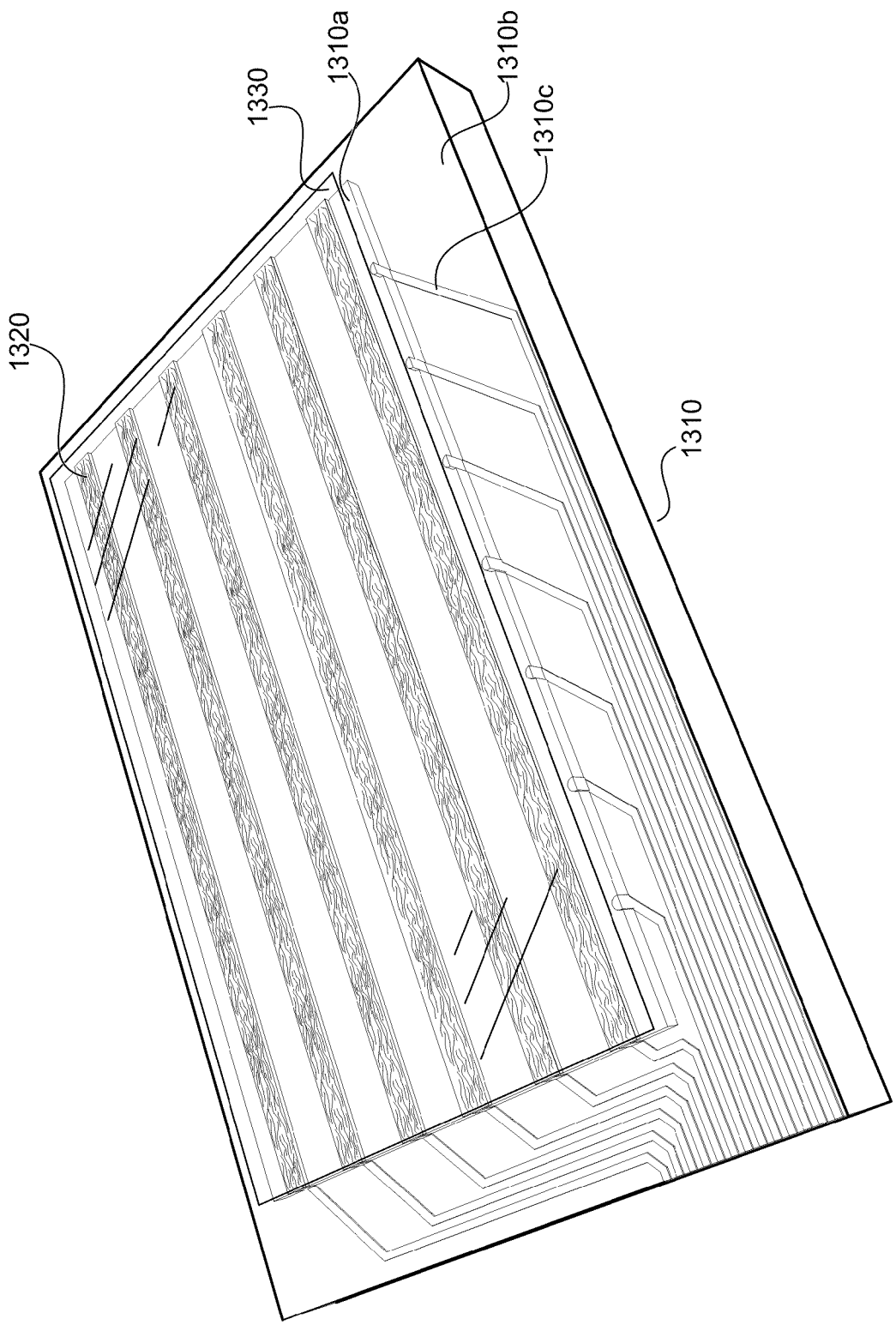
Figure 13D:
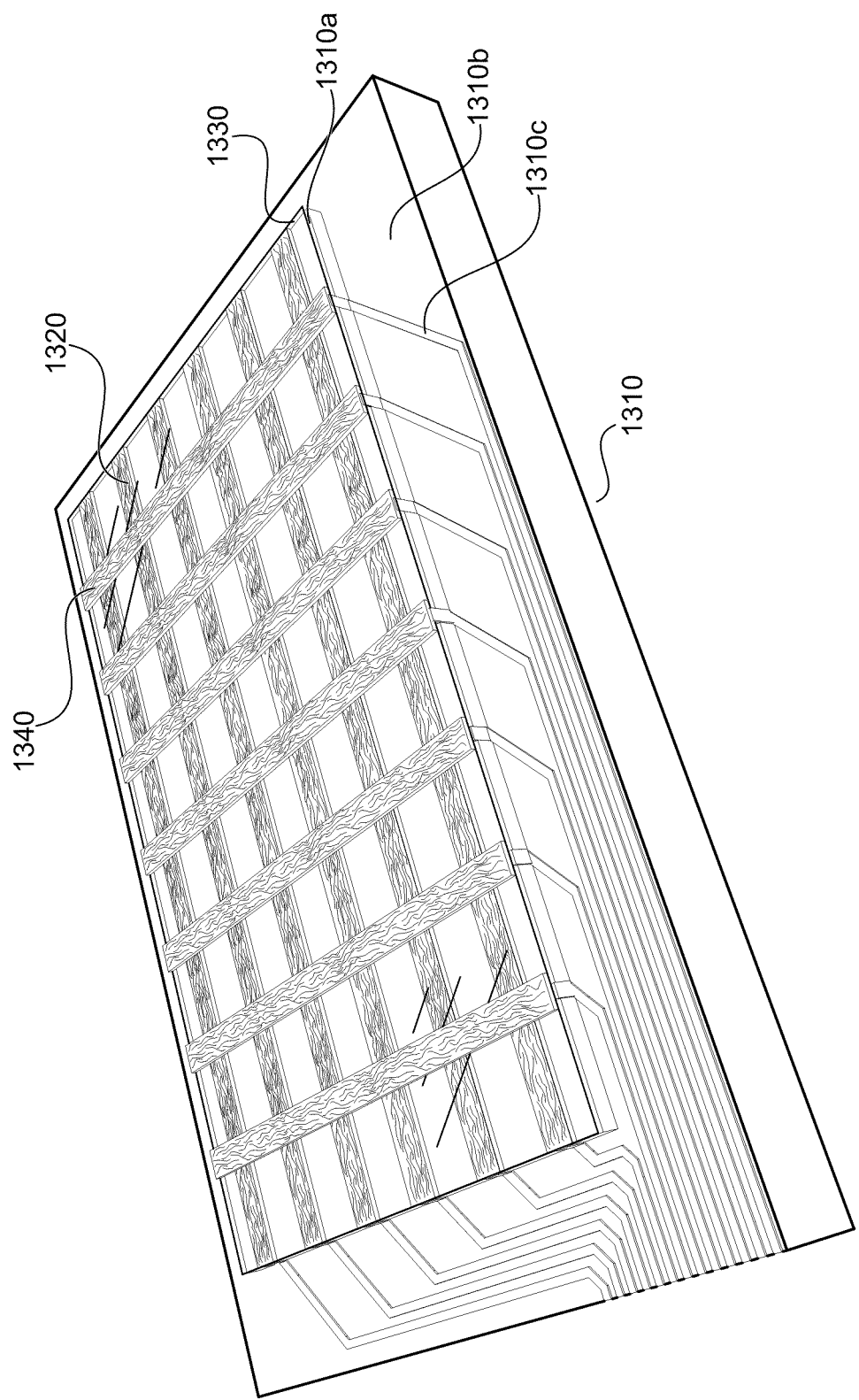
Figure 13E:
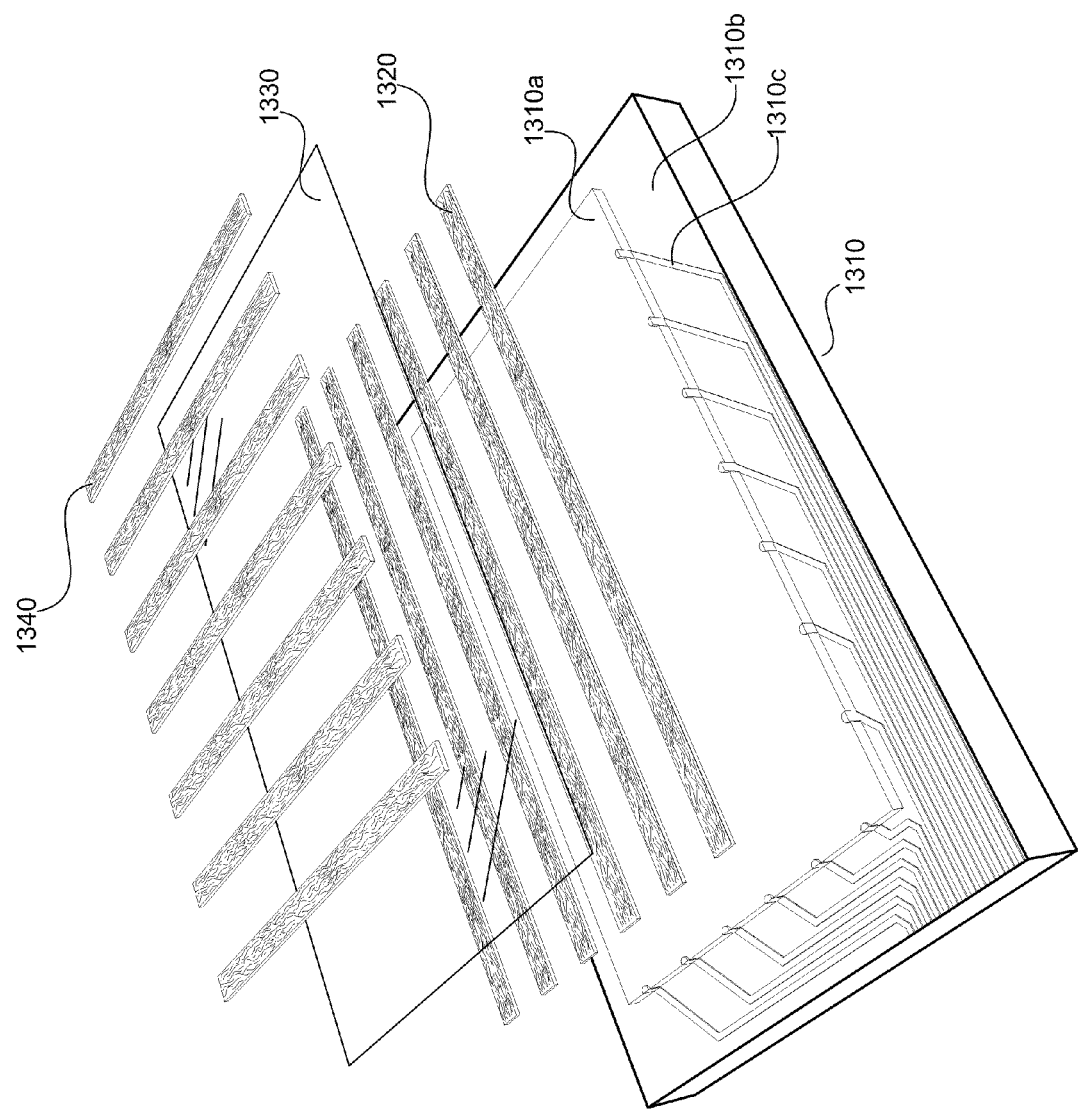

Referring now to FIG. 13C, a transparent dielectric layer 1330 is deposited over horizontally oriented anisotropic nanotube fabric articles 1320, providing a new substrate surface above—and electrically isolated from—horizontally oriented nanotube fabric articles 1320. Referring now to FIG. 13D, a plurality of vertically oriented anisotropic nanotube fabric articles 1340 are deposited over transparent dielectric layer 1330 such that each nanotube fabric article 1340 makes electrical contact with a trace element 1310c. FIG. 13E provides an exploded view of the entire assembly.

Due to their anisotropic nature, horizontally oriented nanotube fabric articles 1320 and vertically oriented nanotube fabric articles 1340 may be kept relatively thin while still remaining sufficiently conductive. This allows for both sets of fabric articles 1320 and 1340 to remain highly transparent and not impede the function of display screen element 1310a. In this way, a plurality of narrow anisotropic nanotube fabric articles (horizontally oriented nanotube fabric articles 1320 and vertically oriented nanotube fabric articles 1340) are used to create a plurality of cross point capacitive switch elements, which can be used to provide a transparent touch screen interface over display screen element 1310a.

It should be noted, that the individual nanotube elements depicted in FIGS. 13D-13E are not necessarily to scale, but have been drawn simply to imply the anisotropic nature of the nanotube fabric articles 1320 and 1340.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A method of forming an anisotropic nanotube fabric layer onto a substrate element, which comprises:

suspending a first plurality of nanotube elements within a solvent to form a nanotube application solution;

rendering said nanotube application solution into a nematic state by adjusting the concentration level of said nanotube application solution; and applying said rendered nanotube application solution over said substrate element.

2. The method of claim 1, wherein said first plurality of nanotube elements are carbon nanotubes.

3. The method of claim 1, wherein the step of rendering is achieved by increasing the concentration of said nanotube elements within said nanotube application solution.

4. The method of claim 3, wherein the concentration of said nanotube elements within said nanotube application solution is increased by adding a second plurality of nanotube elements to said solvent.

5. The method of claim 3, wherein the concentration of said nanotube elements within said nanotube application solution is increased by removing a volume of said solvent.

6. The method of claim 3, wherein the step of rendering is achieved by increasing the concentration of said nanotube elements from a first value below about 0.005 g/ml to a second value above about 0.05 g/ml.

7. The method of claim 1, wherein the step of applying is selected from the group consisting of a spin coating operation, a dip coating operation and a spray coating operation.

8. The method of claim 1, wherein the substrate is flexible.

* * * * *